US008232038B2

(12) United States Patent
Hirakata et al.

(10) Patent No.: US 8,232,038 B2
(45) Date of Patent: Jul. 31, 2012

(54) MANUFACTURING APPARATUS AND MANUFACTURING METHOD OF LIGHT-EMITTING DEVICE

(75) Inventors: Yoshiharu Hirakata, Kanagawa (JP); Hisao Ikeda, Kanagawa (JP); Takahiro Ibe, Kanagawa (JP); Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 1051 days.

(21) Appl. No.: 12/123,902

(22) Filed: May 20, 2008

(65) Prior Publication Data
US 2008/0299496 A1 Dec. 4, 2008

(30) Foreign Application Priority Data
Jun. 1, 2007 (JP) .................. 2007-147413

(51) Int. Cl.
*H01L 21/00* (2006.01)
(52) U.S. Cl. .................. 430/201; 430/319; 430/321
(58) Field of Classification Search .................. None
See application file for complete search history.

(56) References Cited

U.S. PATENT DOCUMENTS

| | | | |
|---|---|---|---|
| 5,937,272 A | 8/1999 | Tang | |
| 6,165,543 A | 12/2000 | Otsuki et al. | |
| 6,283,060 B1 | 9/2001 | Yamazaki et al. | |
| 6,689,492 B1 | 2/2004 | Yamazaki et al. | |
| 6,703,179 B2 | 3/2004 | Tyan | |
| 6,776,847 B2 | 8/2004 | Yamazaki et al. | |
| 6,887,650 B2 | 5/2005 | Shimoda et al. | |
| 6,890,627 B2 | 5/2005 | Culver et al. | |
| 7,316,983 B2 | 1/2008 | Yamazaki et al. | |
| 7,443,095 B2 | 10/2008 | Kang et al. | |
| 7,485,337 B2 | 2/2009 | Nguyen et al. | |
| 2004/0065902 A1 | 4/2004 | Yamazaki et al. | |
| 2005/0005848 A1 | 1/2005 | Yamazaki et al. | |
| 2005/0016463 A1 | 1/2005 | Hirano | |

(Continued)

FOREIGN PATENT DOCUMENTS
EP 1 387 418 A2 2/2004
(Continued)

OTHER PUBLICATIONS
Office Action re Chinese application No. CN 200810099994.1, dated May 17, 2011 (with English translation).
(Continued)

*Primary Examiner* — John A. McPherson
(74) *Attorney, Agent, or Firm* — Husch Blackwell LLP

(57) ABSTRACT

Demands such as higher definition, higher opening aperture, and higher reliability on a full-color flat panel display have been increased. Such demands are big objects in advancing higher definition (increase in the number of pixels) of a light-emitting device and miniaturization of each display pixel pitch with reduction in size of the light-emitting device. An organic compound-containing layer is selectively deposited using a laser beam which passes through openings of a mask. An irradiated substrate provided with a light absorption layer and a material layer containing an organic compound and a deposition substrate provided with first electrodes are placed so as to face each other. The light absorption layer is heated by a laser beam which has passed through the openings of the mask, and the organic compound at a position overlapping with the heated region is vaporized, and accordingly the organic compound is selectively deposited over the deposition substrate.

12 Claims, 12 Drawing Sheets

U.S. PATENT DOCUMENTS

| | | |
|---|---|---|
| 2005/0106839 A1 | 5/2005 | Shimoda et al. |
| 2006/0043889 A1* | 3/2006 | Kim et al. ............... 313/506 |
| 2006/0188825 A1 | 8/2006 | Kang et al. |
| 2006/0243377 A1 | 11/2006 | Matsuo et al. |
| 2008/0081115 A1 | 4/2008 | Yamazaki et al. |
| 2008/0260938 A1 | 10/2008 | Ikeda et al. |
| 2009/0220706 A1 | 9/2009 | Yamazaki et al. |

FOREIGN PATENT DOCUMENTS

| | | |
|---|---|---|
| EP | 2004-71551 | 3/2004 |
| EP | 1 455 394 A1 | 9/2004 |
| JP | 2000-256877 | 9/2000 |
| JP | 2003-313654 | 11/2003 |
| JP | 2004-103406 | 4/2004 |
| JP | 2004-220852 | 8/2004 |
| JP | 2005-81299 | 3/2005 |
| JP | 2006-114470 | 4/2006 |
| JP | 2006-231407 | 9/2006 |
| JP | 2006-302636 | 11/2006 |
| WO | WO 03/010825 A1 | 2/2003 |
| WO | WO 2005/069398 A2 | 7/2005 |
| WO | WO 2005/119804 A2 | 12/2005 |

OTHER PUBLICATIONS

Urabe, T. et al, "13.1: Invited Paper: Technological Evolution for Large Screen Size Active Matrix OLED Display," SID 07 Digest, SID International Symposium Digest of Technical Papers, 2007, pp. 161-164.

* cited by examiner

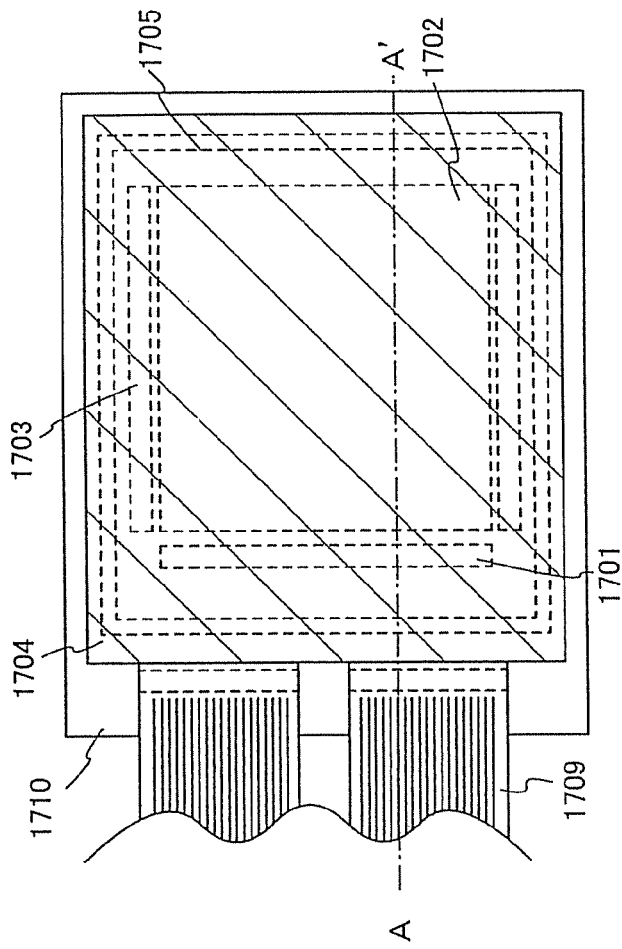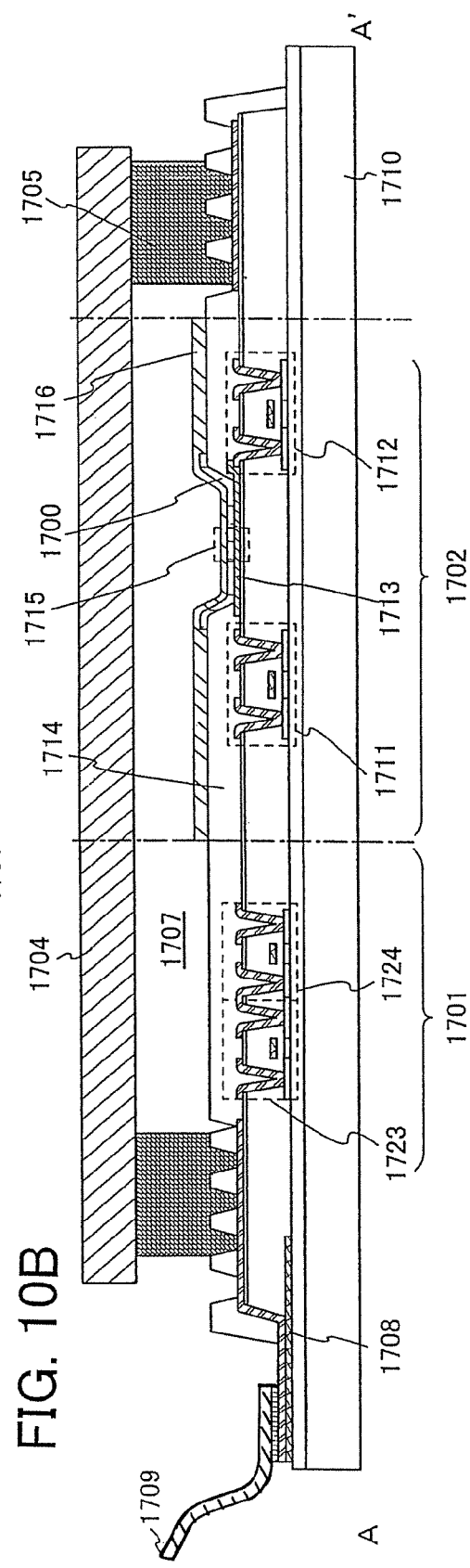
FIG. 10A
FIG. 10B

MANUFACTURING APPARATUS AND MANUFACTURING METHOD OF LIGHT-EMITTING DEVICE

BACKGROUND OF THE INVENTION

1. Field of the Invention

The present invention relates to a deposition apparatus used for depositing a material which is capable of being deposited over a substrate, and a manufacturing apparatus provided with the deposition apparatus. The present invention also relates to a deposition method using the deposition apparatus. The present invention also relates to a light-emitting device including an organic compound-containing layer, which is formed using the deposition apparatus, as a light-emitting layer, and a manufacturing method of the light-emitting device.

2. Description of the Related Art

A light-emitting element using, as a luminous body, an organic compound which has characteristics such as thinness, lightness in weight, high-speed response, and DC drive at low voltage, is expected to be applied to a next-generation flat panel display. In particular, a display device in which light-emitting elements are arranged in matrix is considered to have an advantage in a wide viewing angle and excellent visibility over a conventional liquid crystal display device.

A light-emitting element is said to have an emission mechanism in which by application of voltage to a pair of electrodes with an organic compound-containing layer interposed therebetween, electrons injected from a cathode and holes injected from an anode are recombined in an emission center of the organic compound-containing layer to form molecular excitons and the molecular excitons release energy in returning to a ground state; accordingly light is emitted. As excited states, a singlet excited state and a triplet excited state are known, and light emission is considered to be possible through either of these excited states.

For a light-emitting device in which such light-emitting elements are arranged in matrix, a driving method such as passive matrix driving (simple matrix type) or an active matrix driving (active matrix type) can be used. However, when the pixel density is increased, the active matrix type where each pixel (or each dot) is provided with a switch is considered to be advantageous because it is capable of lower voltage driving.

The organic compound-containing layer has a structure typified by a stacked structure of a hole transporting layer, a light-emitting layer, and an electron transporting layer. As a deposition method of these organic compound material, an ink jet method, an evaporation method, a spin coating method, or the like are known. EL materials for forming EL layers are broadly classified into low molecular (monomer) materials and high molecular (polymer) materials. An evaporation apparatus is used for depositing low molecular materials.

In a conventional evaporation apparatus, a substrate is set on a substrate holder, and a crucible (or an evaporation boat) which contains an EL material, that is, an evaporation material, a shutter for preventing the rise of the EL material to be sublimated, and a heater for heating the EL material in the crucible are included. The EL material heated by the heater is sublimated to be deposited on a rotating substrate. At this time, the substrate and the crucible are kept from each other with a distance of greater than or equal to one meter for uniform deposition.

When manufacture of a full-color flat panel display using emission colors of red, green, and blue is considered, because the accuracy of deposition is not so high, pixels are designed so as to have wide intervals therebetween, or an insulator called a bank is provided between the pixels.

Demands such as higher definition, higher opening aperture, and higher reliability on a full-color flat panel display using emission colors of red, green, and blue have been increased. Such demands are big objects in advancing higher definition (increase in the number of pixels) of a light-emitting device and miniaturization of each display pixel pitch with reduction in the size of the light-emitting device. At the same time, demands such as increase of productivity and reduction in cost have also been increased.

The present applicants describe an example of a cross section of an evaporation mask in Patent Document 1 (Japanese Published Patent Application No. 2003-313654). In either cross-sectional structure of the evaporation mask disclosed in Patent Document 1, the vicinity of an opening of the mask is sharp. A tapered shape is given as an example of the cross-sectional structure of the evaporation mask.

SUMMARY OF THE INVENTION

The present invention provides a manufacturing apparatus provided with an evaporation apparatus that is one of manufacturing apparatuses which reduce manufacturing cost by enhancement of EL material use efficiency and has excellent uniformity or throughput of deposition of an EL layer, in the case where a full-color flat panel display using emission colors of red, green, and blue is manufactured.

Evaporation accuracy is a big problem when higher definition (increase in the number of pixels) of a light-emitting device and miniaturization of each display pixel pitch with reduction in the size of the light-emitting device is advanced. At the stage before evaporation, higher definition and miniaturization of each display pixel pitch can be realized if the following measures are taken: the layout of the pixels is designed so that an interval between the pixels is small, the width of an insulator called bank (or partition wall) provided between the pixels is reduced, or the like. As for a conventional evaporation apparatus, however, at the stage of evaporation, the evaporation accuracy is not enough if the width of a bank or an interval between adjacent pixels is made to be small, for example, less than or equal to 10 μm.

In addition, it is an object of the present invention to provide an evaporation apparatus with high evaporation accuracy that makes it possible to promote higher definition (increase in the number of pixels) of a light-emitting device and miniaturization of each display pixel pitch with and reduction in the size of the light-emitting device.

The manufacturing apparatus disclosed in this specification includes at least a light source of laser light; an optical system that forms laser light into a rectangular beam; a light control unit (e.g., a mask or a slit) that selectively blocks or reflects the rectangular laser beam; a unit for holding a substrate to be irradiated (hereinafter, the substrate is referred to as an irradiated substrate) (e.g., a substrate holder); a unit for holding a substrate over which a film is to be deposited (hereinafter, the substrate is referred to as a deposition substrate); and a control apparatus.

In order to obtain a laser beam with intensity for forming a thin film, a rectangular beam or a linear beam is preferable which is condensed more easily than a planar beam with a large area that makes the whole surface of a substrate irradiated at once.

As the light control unit, a mask, a slit, or a photomask from which diffraction of a laser beam is less likely to occur. For example, it is preferable to use a mask whose openings have an inner wall that is along the laser beam direction without using a mask in which the vicinity of an opening is sharply tapered. In addition, the mask can be made thick in the range of greater than or equal to 100 μm and less than 1 cm because an evaporation material does not pass through the opening of the mask unlike an evaporation mask whose thickness is increased for increase in deposition accuracy. It can be said that when the mask is thicker, the mask is less subjected to influence by heat and diffraction of the laser beam is less likely to occur. As a material for a mask or a slit, the following is desirably used: a metal material with low coefficient of thermal expansion that is not easily transformed by heat (e.g., a refractory metal such as tungsten, tantalum, chromium, nickel, or molybdenum; an alloy containing these elements; stainless steel; inconel; or hastelloy). It is desirable to use a mask using a material with the same coefficient of thermal expansion as a material used for an irradiated substrate. Although the mask can be heated at the time of laser beam irradiation, misalignment is difficult to occur as long as the mask itself has the same amount of expansion as the irradiated substrate.

Selective laser beam irradiation can be performed by combination of a plurality of masks. Both a slit and a mask can also be used.

A position of a focal point of a laser beam can be controlled by an optical system, and thus a region which is smaller than the opening of the mask can be partially heated. In particular, the thicker the irradiated substrate is, the longer the length of a light pass is, and thus, placement of the optical system, the light control unit, and the irradiated substrate is performed in consideration of this.

One aspect of the present invention disclosed in this specification is a manufacturing apparatus including a light source unit which emits laser light; an optical system which forms the laser light into a rectangular laser beam or a linear laser beam; a light control unit which selectively blocks or reflects the rectangular laser beam or the linear laser beam; a scanning unit which makes a light absorption layer provided for an irradiated substrate be scanned by a laser beam which has passed through the light control unit; and an alignment unit which performs alignment of the light control unit, the irradiated substrate, and the deposition substrate, where the laser beam which has passed through the light control unit heats the light absorption layer and the light absorption layer heats a first material layer provided for the irradiated substrate, so that at least part of the first material layer is gasified, and accordingly a second material layer is formed over the deposition substrate placed facing the irradiated substrate. A low molecular organic material, a high molecular organic material, or a middle molecular organic material which has a property between low molecule and high molecule can be used for the first material layer. Alternatively, a composite material of an organic material and an inorganic material can be used for the first material layer.

In the above-described structure, as the scanning unit which makes a surface of the light absorption layer be scanned by a laser beam, a unit for fixing the optical system and moving the substrate stage, or a unit for fixing the substrate stage and moving an irradiated region with the laser beam may be used. As for the unit for moving an irradiated region with a laser beam, a polygon mirror, a galvanometer mirror, or an acousto-optic deflector (AOD) is desirably used.

The present invention solves at least one of the above-described problems.

When a full-color flat panel display using emission colors of red, green, and blue is manufactured, at least three irradiated substrates are prepared in order to form, as appropriate, a red light-emitting layer, a green light-emitting layer, and a blue light-emitting layer. Although a different mask may be used for each light-emitting layer, one mask can be used while the mask is moved, by position adjustment of the irradiated substrate and the mask in accordance with a position where the light-emitting layer is to be formed. The manufacturing apparatus of the present invention has a structure in which few organic compounds are attached to the mask. In addition, the mask can be repeatedly used in such a manner that one irradiated substrate prepared for forming the light-emitting layer is reused, the positions of the mask and the irradiated substrate are displaced, that is, the mask is moved. Accordingly, material use efficiency can be increased. For example, when a full-color flat panel display using light emission colors of red, green, and blue is manufactured, after a first deposition of the red light-emitting layer is terminated, part of a material layer provided for the first irradiated substrate is removed, and an area between two adjacent removed areas corresponds to an area for two pixels. Thus, successive move of the position of the mask enables one deposition over each of the second deposition substrate and the third deposition substrate.

Light-emitting elements which emit light of colors other than red, green, and blue may be used. Image display may be performed in combination with a color of white, cyan, magenta, amber, orange, yellow, or the like. For example, full-color display may be performed by RGBW four-color driving by use of four kinds of light-emitting elements.

In the above-described structure, for the light absorption layer, a material such as gold, platinum, copper, silver, tungsten, tantalum, titanium, or molybdenum, or an alloy material of these materials can be used. In addition, the light absorption layer can also be referred to as a heat generation layer.

A layer which generates gas when irradiated with light (also referred to as a gas generation layer) may be used instead of the light absorption layer. A gas generation layer and a layer containing an organic compound are stacked over an irradiated substrate, laser light is selectively emitted through a mask to generate gas, and the layer containing an organic compound is selectively separated, and accordingly the layer containing an organic compound layer is deposited over a deposition substrate.

Another aspect of the present invention is a manufacturing apparatus including a light source unit which emits laser light; an optical system which forms the laser light into a rectangular laser beam or a linear laser beam; a light control unit which selectively blocks or reflects the rectangular laser beam or the linear laser beam; a scanning unit which makes a gas generation layer provided over an irradiated substrate be scanned by a laser beam which has passed through the light control unit; and an alignment unit which performs alignment of the light control unit, the irradiated substrate stacked with the gas generation layer and a first material layer, and a deposition substrate, where the laser beam which has passed through the light control unit heats the gas generation layer provided for the irradiated substrate to gasify the gas generation layer, and accordingly a second material layer is formed over the deposition substrate placed facing the irradiated substrate. A low molecular organic material, a high molecular organic material, or a middle molecular material which has a property between low molecule and high molecule can be used for the first material layer. Alternatively, a composite material of an organic material and an inorganic material can be used for the first material layer.

In the above-described structure, for the layer which generates gas when irradiated with light, an amorphous silicon film containing hydrogen; an azide compound or a diazo compound which generates gas when irradiated with ultraviolet rays and decomposition is generated; a resin composition in which microscopic bubbles are included; or the like can be used.

Another aspect of the present invention is a manufacturing method of a light-emitting device, including the steps of forming a layer which generates gas by light irradiation over one of surfaces of an irradiated substrate; forming a material layer over the gas generation layer; placing a deposition substrate so that one of surfaces of the deposition substrate faces the one of the surfaces of the irradiated substrate; and emitting light which passes through the other surface of the irradiated substrate to the gas generation layer to deposit a material layer over the one of the surfaces of the deposition substrate. Light may be selectively emitted to the gas generation layer by use of a photomask, a metal mask, or a slit to selectively deposit the material layer over the one of the surfaces of the deposition substrate. When a photomask, a metal mask, a slit, or the like is used, the small size of an opening thereof makes it easier for the material layer to be deposited over the one of the surfaces of the deposition substrate.

As for the above-described manufacturing method, the light is not limited to a laser beam. An electric discharge lamp such as a flash lamp (e.g., a xenon flash lamp or a krypton flash lamp), a xenon lamp, or a metal halide lamp; a heat generation lamp such as a halogen lamp or a tungsten lamp can be used.

As the light source of laser light, one or more of the following can be used: a gas laser such as an Ar laser, a Kr laser, or an excimer laser; a laser of which medium is single crystal YAG, YvO$_4$, forsterite (Mg$_2$SiO$_4$), YAlO$_3$, or GdVO$_4$, or polycrystalline (ceramic) YAG, Y$_2$O$_3$, YVO$_4$, YAlO$_3$, or GdVO$_4$, added with one or more of Nd, Yb, Cr, Ti, Ho, Er, Tm, and Ta as a dopant; a glass laser; a ruby laser; an alexandrite laser; a Ti:sapphire laser; a copper vapor laser; or a gold vapor laser. When a solid-state laser whose laser medium is solid is used, there are advantages in that a maintenance-free condition can be maintained for a long time and output is relatively stable.

The control apparatus includes a memory portion (e.g., RAM or ROM) for storing design data of a semiconductor device and a microprocessor including a CPU or the like and controls a position of a surface of the irradiated substrate which is to be irradiated with laser light which has passed through the light control unit. For example, when a stage to which the deposition substrate is fixed is moved, emission timing of the laser light source and moving speed of the stage are synchronized. In order to prevent a mask to be heated, on and off of the laser light source is controlled with use of the control apparatus and a laser beam may be selectively emitted to a band-like region including openings of the mask while the stage is moved. In the present invention, it is not particularly necessary that the whole light absorption layer or the whole gas generation layer be scanned by laser light.

There is no particular limitation on the shape of the openings of the mask seen from above. Pixel arrangements such as a mosaic type in which sequential arrangement in a column direction or a row direction is performed, a delta type in which unit pixels are arranged in a zigzag manner in a column direction, and a stripe type in which light-emitting elements which emit light of the same color are arranged per pixel column can be realized using the mask.

Note that the light-emitting device in this specification refers to a light-emitting device or a light source (including a lighting system in its category) without limitation to a light-emitting device that is capable of full-color display. In addition, the light-emitting device includes any of the following modules in its category: a module in which a connector such as an FPC (flexible printed circuit), a TAB (tape automated bonding) tape, or a TCP (tape carrier package) is attached to a light-emitting device; a module having a TAB tape or a TCP provided with a printed wiring board at the end thereof; and a module having an IC (integrated circuit) directly mounted over a light-emitting element by a COG (chip on glass) method.

Material use efficiency is increased by the manufacturing apparatus of the present invention, whereby manufacturing cost can be reduced. In addition, since an area of a region to be vaporized or the amount of material to be vaporized is limited by the manufacturing apparatus of the present invention, whereby attachment of a vaporized material to an inner wall of a deposition chamber can be suppressed. Thus, frequency of cleaning of the deposition chamber can be reduced.

BRIEF DESCRIPTION OF THE DRAWINGS

In the accompanying drawings:
FIGS. 10A and 10B are views illustrating a structure of a light-emitting device.

DETAILED DESCRIPTION OF THE INVENTION

Figure 1:
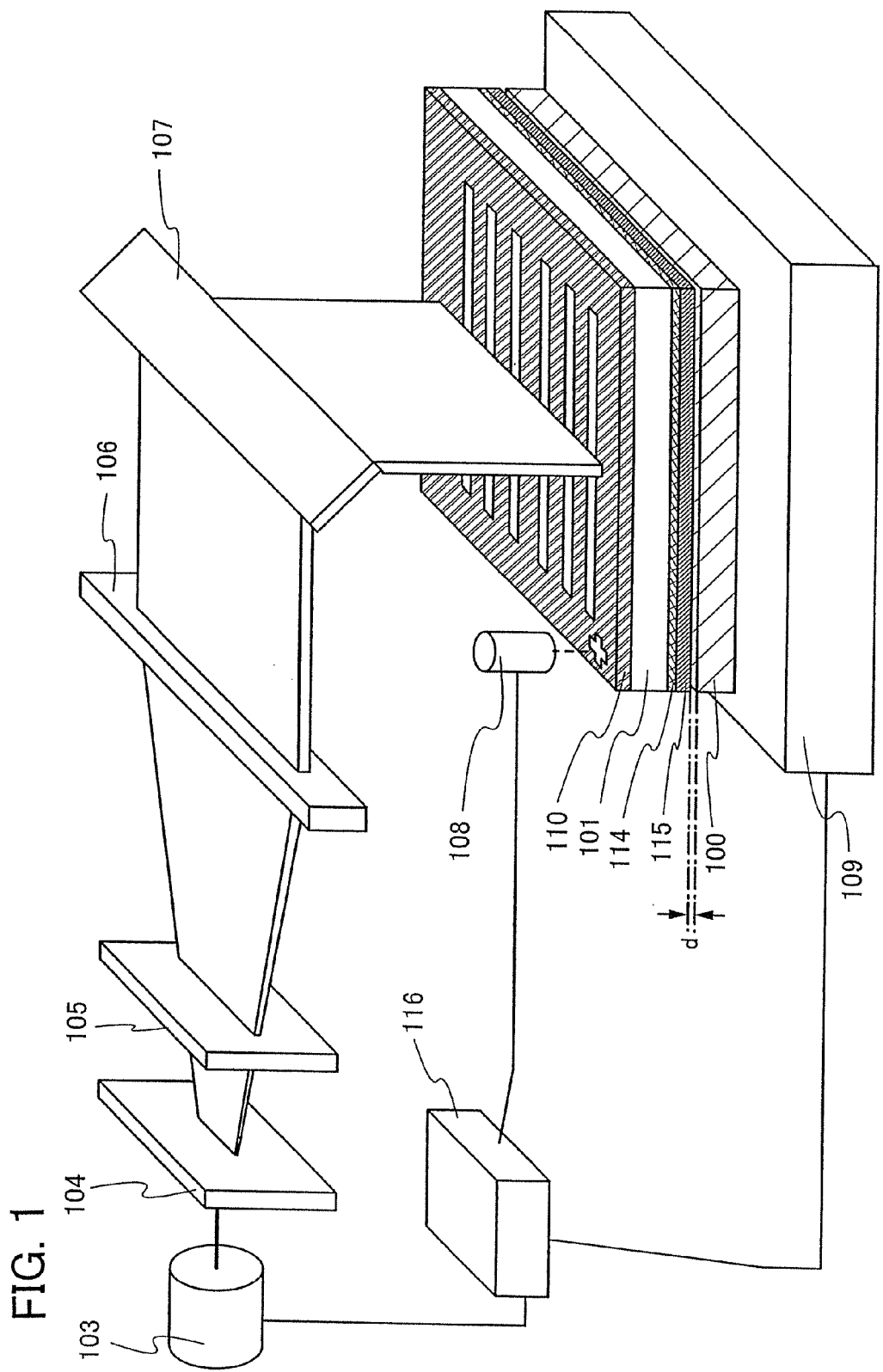
FIG. 1 is a perspective view illustrating a manufacturing apparatus.

Embodiment Modes of the present invention will be hereinafter described.
[Embodiment Mode 1]
FIG. 1 is a perspective view illustrating an example of a manufacturing apparatus of the present invention. Laser light to be emitted is output from a laser oscillator 103 (e.g., a YAG laser apparatus or an excimer laser apparatus); the laser light passes through a first optical system 104 for forming a laser beam into a rectangular laser beam, a second optical system 105 for shaping the laser beam, and a third optical system 106 for collimating the laser beam; and an optical path is changed into a direction perpendicular to an irradiated substrate 101 by use of a reflecting mirror 107. After that, the laser beam passes through a mask 110 having openings which selectively transmits light so that a light absorption layer 114 is irradiated with the laser beam.

A material which can be resistant to irradiation with laser light is used for the mask 110 having the openings. In addition, a mask whose openings have an inner wall that is along the laser beam direction is used without using a mask in which the vicinity of an opening is sharply tapered.

The shape of a laser spot with which a layer (a light absorption layer or a gas generation layer) provided for the irradiated substrate is irradiated is desirably rectangular or linear. Specifically, a rectangular laser spot, a short side of which is 1 to 5 mm and a long side of which is 10 to 50 mm may be used. When a large-area substrate is used, it is desirable that the long side of the laser spot be 20 to 100 cm in order to shorten the processing time. In addition, a plurality of laser oscillators and optical systems shown in FIG. 1 may be provided to process a large-area substrate in a short time. Specifically, a laser beam may be emitted from each of the plurality of laser oscillators so that the area to be processed of one substrate is divided by the laser beams.

Note that FIG. 1 shows an example, and there is no particular limitation on a positional relationship of each optical system or electrooptical element placed along the path of laser light. For example, a reflective mirror is not needed to use if the laser oscillator 103 is placed above the irradiated substrate 101 so that laser light emitted from the laser oscillator 103 is perpendicular to a principle plane of the irradiated substrate 101. As each optical system, a collective lens, a beam expander, a homogenizer, a polarizer, or the like may be used, or these may be combined. In addition, as each optical system, a slit may be used in combination.

Scan by a laser beam is two-dimensionally performed as appropriate with respect to an irradiated surface, whereby a large area of the substrate is irradiated with the laser beam. The irradiated region with the laser beam and the substrate are substantially moved so that scanning can be performed. In this embodiment mode, scanning is performed by a moving unit (not shown) which moves the substrate stage 109 which is holding the substrate in a horizontal direction.

The control device 116 is desirably interlocked so that it can also control the moving unit which moves the substrate stage 109 in the horizontal directions. In addition, the control device 116 is desirably interlocked so that it can also control the laser oscillator 103. Moreover, the control device 116 is preferably interlocked with a position alignment system which has an image pickup device 108 for recognizing position markers.

The position alignment system aligns the mask 110, the irradiated substrate 101, and a deposition substrate 100. Although the mask 110 and the irradiated substrate 101 may be arranged so as to be in contact with each other, the mask 110 and the irradiated substrate 101 preferably have an interval therebetween in order to prevent conduction of heat from the mask 110.

The light absorption layer 114 and a material layer 115 are stacked in this order in advance over one of surfaces of the irradiated substrate 101 which is irradiated with a laser beam. A heat resistance metal is desirably used for the light absorption layer 114. For example, tungsten, tantalum, or the like is used.

The irradiated substrate 101 and the deposition substrate 100 are placed so that interval d therebetween is at least less than or equal to 5 mm. In addition, when the deposition substrate 100 is provided with an insulator which serves as a partition wall, the insulator and the material layer 115 may be placed so as to be in contact with each other.

When deposition is performed with use of the manufacturing apparatus shown in FIG. 1, at least the irradiated substrate 101 and the deposition substrate 100 are placed in a vacuum chamber. Alternatively, all the components shown in FIG. 1 may be placed in a vacuum chamber.

Although the manufacturing apparatus shown in FIG. 1 is an example of a so-called face-up deposition apparatus in which a deposition surface of the deposition substrate 100 faces upward, a face-down deposition apparatus may also be employed. When the deposition substrate 100 is a large-area substrate, a so-called vertical placement apparatus may also be employed in which a main plane of the deposition substrate 100 is perpendicular to a horizontal plane in order to suppress distortion of the center of the substrate due to its own weight.

When a cooling unit for cooling the deposition substrate 100 is provided, a flexible substrate such as a plastic substrate can be used as the deposition substrate 100.

When a plurality of manufacturing apparatuses described in this embodiment mode is provided, a multi-chamber manufacturing apparatus can be obtained. Needless to say, combination with a deposition apparatus which employs another deposition method is possible. In addition, when a plurality of manufacturing apparatuses described in this embodiment mode is arranged in series, an in-line manufacturing apparatus can be obtained.

[Embodiment Mode 2]

Figure 2A:
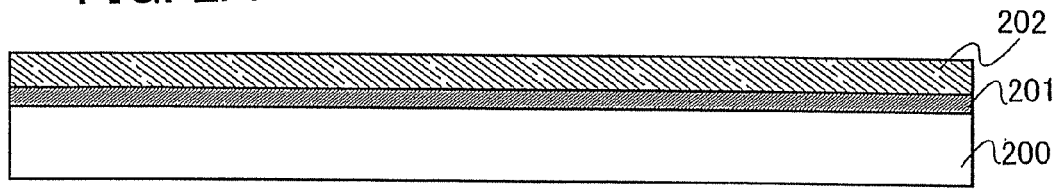
FIGS. 2A to 2C are cross-sectional views illustrating a manufacturing method of a light-emitting device.
Figure 2B:
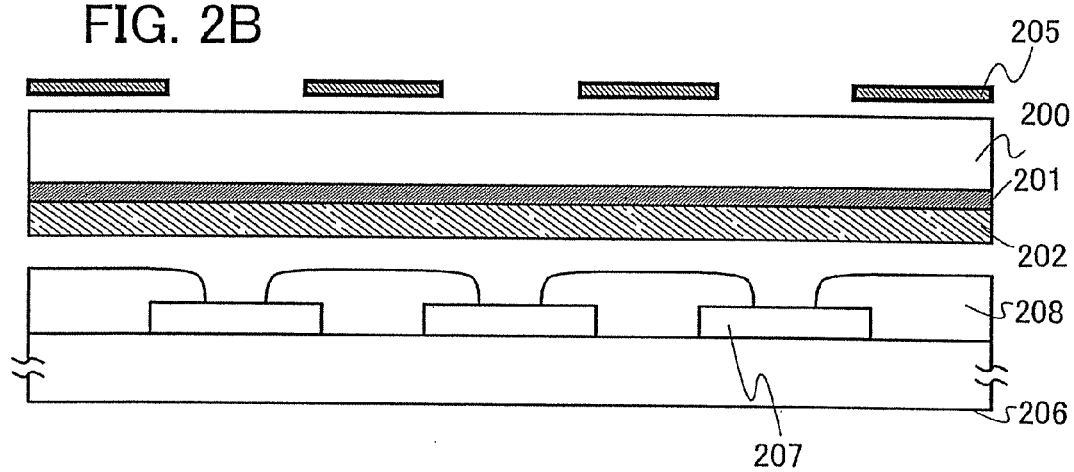
Figure 2C:
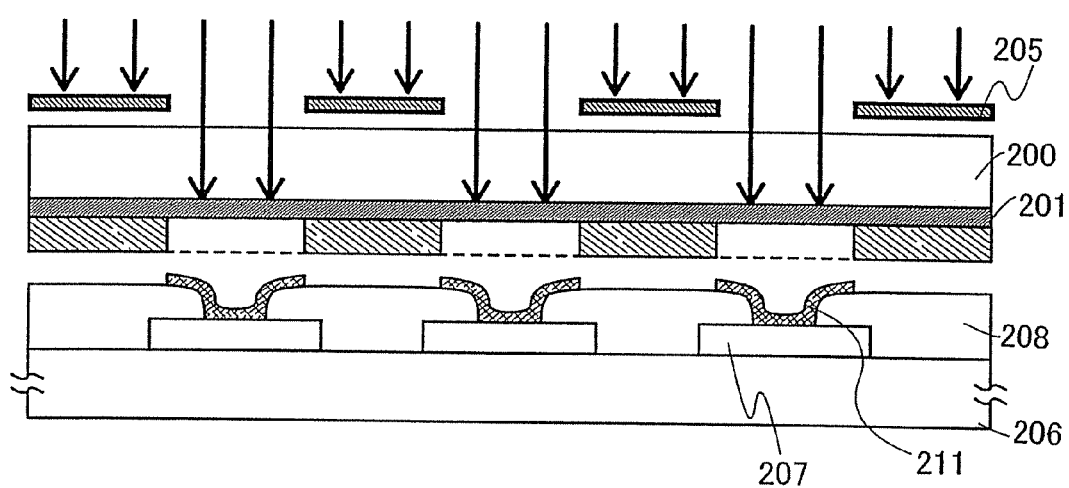

In this embodiment mode, FIGS. 2A to 2C show states before and after deposition with use of the manufacturing apparatus shown in FIG. 1.

A light-transmitting glass substrate is used as an irradiated substrate 200. A light absorption layer 201 is formed over the irradiated substrate 200, and an organic compound-containing layer 202 is formed over the light absorption layer (FIG. 2A).

The light absorption layer 201 is formed using a target such as tantalum, titanium, molybdenum, or tungsten or a target using an alloy of these metals by a sputtering method or the like. In this embodiment mode, a tungsten film is formed to a thickness of 100 nm by a sputtering method. The light absorption layer 201 is formed to a thickness of greater than or equal to 10 nm, whereby the light absorption layer 201 can absorb a laser beam and generate heat. Note that part of a laser beam may be transmitted through the light absorption layer 201 as long as the light absorption layer 201 generates heat till the sublimation temperature of the organic compound contained in the organic compound-containing layer 202. Note that, when part of a laser beam is transmitted through the light absorption layer 201, an organic compound which is not decomposed even by laser beam irradiation is desirably used.

For the organic compound-containing layer 202, liquid in which an organic compound (or a precursor thereof) is dissolved or dispersed in a solvent is applied as application liquid by a wet process such as a spin coating method, a spray coating method, or a dip coating method. A composite material of an inorganic material such as molybdenum oxide and an organic material may be used for the organic compound-containing layer 202. The organic compound is desirably soluble or dispersive in a solvent. The thickness and uniformity of an organic compound-containing layer 211 which is to be formed over a deposition substrate 206 in a later step depend on the control of this application liquid. Therefore, it is important to uniformly dissolve or disperse the organic compound in the application liquid. When a spin coating method is used, the film thickness can be controlled by the viscosity of the application liquid, the rotation number of the substrate, or the like.

As a solvent, a polar solvent or a nonpolar solvent is used. As a polar solvent, there are THF, acetonitrile, dichloromethane, dichloroethane, and anisole in addition to water, and lower alcohol such as methanol, ethanol, n-propanol, i-propanol, n-butanol, and sec-butanol, and some of these solvents may be mixed to be used. As a nonpolar solvent, there are hexane, benzene, toluene, chloroform, ethyl acetate, tetrahydrofuran, methylene chloride, and the like, and some of these solvents may be mixed to be used.

The organic compound may be selected as appropriate from light-emitting substances described below in accordance with a solvent to be used. For example, in order to obtain reddish light emission, a substance which exhibits light emission having a peak of an emission spectrum at 600 to 680 nm may be used as a light-emitting substance, such as 4-dicyanomethylene-2-isopropyl-6-[2-(1,1,7,7-tetramethyl-julolidine-9-yl)ethenyl]-4H-pyran (DCJTI); 4-dicyanomethylene-2-methyl-6-[2-(1,1,7,7-tetramethyljulolidine-9-yl) ethenyl]-4H-pyran (DCJT), 4-dicyanomethylene-2-tert-butyl-6-[2-(1,1,7,7-tetramethyljulolidine-9-yl)ethenyl]-4H-pyran (DCJTB), periflanthene, or 2,5-dicyano-1,4-bis[2-(10-methoxy-1,1,7,7-tetramethyljulolidine-9-yl)ethenyl] benzene.

In order to obtain greenish light emission, a substance which exhibits light emission having a peak of an emission spectrum at 500 to 550 nm may be used as a light-emitting substance, such as N,N'-dimethylquinacridon (DMQd), coumarin 6, coumarin 545T, or tris(8-quinolinolato)aluminum ($Alq_3$).

In order to obtain bluish light emission, a substance which exhibits light emission having a peak of an emission spectrum at 420 to 500 nm may be used as a light-emitting substance, such as 9,10-bis(2-naphthyl)-tert-butylanthracene (t-BuDNA), 9,9'-bianthryl, 9,10-diphenylanthracene (DPA), 9,10-bis(2-naphthyl)anthracene (DNA), bis(2-methyl-8-quinolinolato)-4-phenylphenolato-gallium (BGaq), or bis(2-methyl-8-quinolinolato)-4-phenylphenolato-aluminum (BAlq).

There is also no particular limitation on the substance which is used with the light-emitting substance in order to disperse the light-emitting substance, and the following can be used, for example: an anthracene derivative such as 9,10-di(2-naphthyl)-2-tert-butylanthracene (t-BuDNA), a carbazole derivative such as 4,4'-bis(N-carbazolyl)biphenyl (CBP); a metal complex such as bis[2-(2-hydroxyphenyl) pyridinato]zinc ($Znpp_2$), or bis[2-(2-hydroxyphenyl)benzoxazolato]zinc (ZnBOX); or the like.

Then, the deposition substrate 206 is placed at a position facing the surface of the irradiated substrate for which the light absorption layer 201 and the organic compound-containing layer 202 are provided. In this specification, a first electrode refers to an electrode which serves as an anode or a cathode of a light-emitting element. In the light-emitting element, a first electrode, an organic compound-containing layer over the first electrode, and a second electrode over the organic compound-containing layer are included. One of the electrodes, which is formed earlier than the other in the formation order is referred to as a first electrode. Edge portions of the first electrode 207 are covered with insulators 208. It is desirable to use a material having a high work function as a material used for the first electrode 207. For example, a stacked structure of a titanium nitride film and a film containing aluminum as its main component; a three-layer structure of a titanium nitride film, a film containing aluminum as its main component, and a titanium nitride film; or the like can be used as well as a single layer of an indium tin oxide film, an indium tin oxide film containing silicon, an indium zinc oxide film, a titanium nitride film, a chromium film, a tungsten film, a zinc film, a platinum film, or the like.

In addition, a mask 205 having openings is placed at a position facing the other surface of the irradiated substrate 200 (FIG. 2B).

Then, a rectangular laser beam is emitted to the mask 205, and a surface of the light absorption layer 201 is scanned by a laser beam which has passed through the openings of the mask 205. Regions of the light absorption layer 201 which are irradiated with the laser beam generate heat, and the organic compound is gasified by use of the heat energy. The gasified organic compound is attached onto the first electrodes 207. Since interval d between the deposition substrate 206 and the irradiated substrate 200 is less than or equal to 5 mm, which is short, then organic compound-containing layers 211 each of which has an area that is almost the same as the area of the opening of the mask are deposited over the deposition substrate 206 (see FIG. 2C). Note that the deposition is performed in a reduced-pressure atmosphere. The reduced-pressure atmosphere is obtained in such a manner that a chamber is evacuated by an evacuation unit to the degree of vacuum of less than or equal to $5\times10^{-3}$ Torr (0.665 Pa), preferably $10^{-4}$ to $10^{-6}$ Pa.

Although FIG. 2C shows an example in which laser light is emitted perpendicularly to a main plane of the irradiated substrate, the present invention is not limited thereto, and the laser light may be obliquely emitted to the main plane of the irradiated substrate. For example, a focal length is changed by control of the thickness of an optical system or the irradiated substrate, whereby the organic compound-containing layer with an area that is smaller than the area of the opening of the mask can also be deposited over the deposition substrate.

Next, the second electrode is formed by an electron beam evaporation method. Aluminum or silver, or an alloy thereof is used for the second electrode. Through the above-described steps, the light-emitting element can be formed.

Although FIG. 2C is a view showing that the organic compound-containing layer 202 at regions which overlap with the regions irradiated with the laser beam disappears, the present invention is not limited thereto. When a polymer in which an organic compound is dispersed is used for the organic compound-containing layer, the organic compound may be selectively gasified so that the polymer remains.

In addition, although FIG. 2C shows an example in which deposition is performed on each of the adjacent first electrodes 207 in one deposition step, light-emitting layers which emit light of different colors are formed in different regions in a plurality of deposition steps when a full-color display device is manufactured.

A manufacturing example of a light-emitting device that is capable of full color display is described below. In this embodiment mode, an example of a light-emitting device using light-emitting layers which emit light of three colors is described.

Three irradiated substrates each of which is the substrate shown in FIG. 2A are prepared. A different organic compound-containing layer is formed over each of the irradiated substrates. Specifically, the first irradiated substrate provided with a material layer for a red light-emitting layer, the second irradiated substrate provided with a material layer for a green light-emitting layer, and the third irradiated substrate provided with a material layer for a blue light-emitting layer are prepared.

In addition, one deposition substrate provided with first electrodes is prepared. Note that it is desirable to provide an insulator which covers edge portions of each of the first electrode and serves as a partition wall so that the adjacent first electrodes are not short-circuited. A region which serves as a light-emitting region corresponds to part of the first electrode, that is, a region which does not overlap with the insulator and is exposed.

Then, the deposition substrate and the first irradiated substrate are stacked. Furthermore, a mask 14 is put over the first irradiated substrate, and the positions of the mask 14 and the irradiated substrate are adjusted. The mask 14 is provided with openings 16 each of which has a size that is almost the same as that of one light-emitting region. The mask 14 is desirably provided with a marker for position adjustment because adjustment of the positions of the openings 16 and the first electrodes provided for the deposition substrate is needed. The deposition substrate is also desirably provided with the marker for position adjustment. Since the first irradiated substrate is provided with a light absorption layer, the light absorption layer near the marker for position adjustment is desirably removed in advance. In addition, since the first irradiated substrate is provided with the material layer for the red light-emitting layer, the material layer for the red light-emitting layer near the marker for position adjustment is also desirably removed in advance.

Then, a linear laser beam is emitted so that a long side direction of the linear laser beam is parallel to the short side of the rectangular opening 16, and scanning is performed in a long side direction of the rectangular opening 16. Using the mask provided with the openings 16 each of which has a size that is almost the same as that of one pixel makes it possible to prevent formation of the material layer between adjacent pixels. The mask having the openings 16 makes it possible to provide a contact portion between the adjacent pixels. That is, in a light-emitting element including the first electrodes and second electrodes over the first electrodes, contact holes for wirings to be electrically connected to the second electrodes provided over the first electrodes can be formed between the adjacent first electrodes. If openings are arranged in stripes, each of which is longer than the total length of two pixels arranged in a lengthwise direction, a material layer can be formed between the two pixels, and thus a step of removing the material layer is needed.

In a region which is irradiated with a laser beam which has passed through the opening 16, the light absorption layer generates heat and an organic compound contained in the material layer for the red light-emitting layer, which is in contact with the light absorption layer, is vaporized, whereby a first deposition is performed onto the first electrode provided over the deposition substrate. After the first deposition, the first irradiated substrate is moved away from the deposition substrate.

Next, the second irradiated substrate is put over the deposition substrate. Then, the same mask 14 is put over the second irradiated substrate and the deposition substrate in such a manner that the position of the mask 14 is shifted by one pixel from the position at the time of the first deposition.

Then, a linear laser beam is emitted so that a long side direction of the linear laser beam is parallel to the short side of the rectangular opening 16, and scanning is performed in a long side direction of the rectangular opening 16.

In a region which is irradiated with a laser beam which has passed through the opening 16, the light absorption layer generates heat and an organic compound contained in the material layer for the green light-emitting layer, which is in contact with the light absorption layer, is vaporized, whereby a second deposition is performed onto the first electrode provided over the deposition substrate. After the second deposition, the second irradiated substrate is moved away from the deposition substrate.

Next, the third irradiated substrate is put over the deposition substrate. Then, the same mask 14 is put over the third irradiated substrate and the deposition substrate in such a manner that the position of the mask 14 is shifted by two pixels from the position at the time of the first deposition.

Figure 3A:
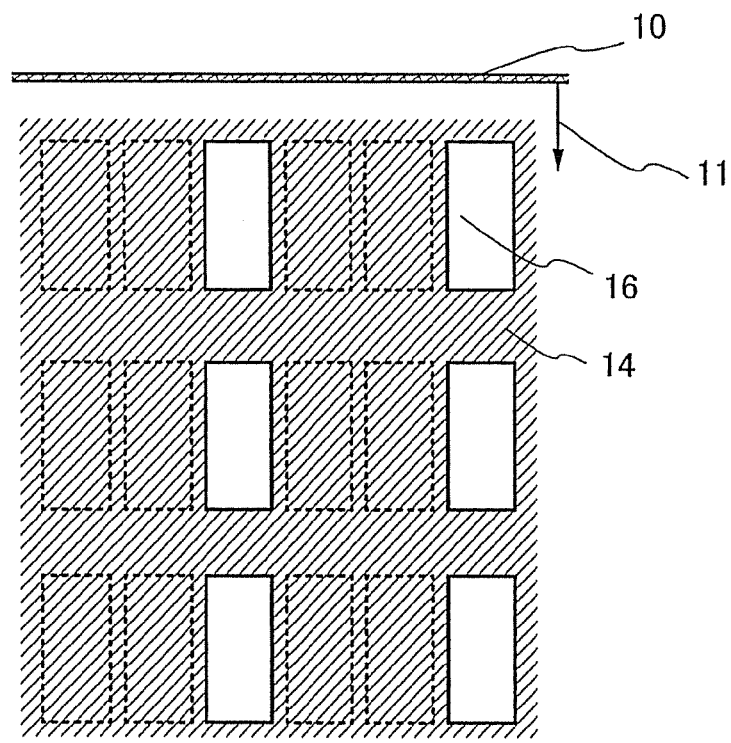
FIGS. 3A and 3B are views each illustrating a positional relationship between openings of a mask and a region irradiated with a laser beam.

Then, a linear laser beam is emitted so that a long side direction of the linear laser beam is parallel to the short side of the rectangular opening 16, and scanning is performed in a long side direction of the rectangular opening 16, whereby third deposition is performed. FIG. 3A is a top view illustrating the state immediately before the third deposition is performed. Exposed regions of the first electrodes which are not covered with an insulator 20 is located at the positions which of which overlaps with the opening 16. The direction indicated by an arrow in FIG. 3A is a scanning direction 11, and an irradiated region 10 of the linear laser beam is substantially moved. Note that first films 21 which have been formed in the first deposition step and second films 22 which have been formed in the second deposition step are located under regions indicated by the dotted lines in FIG. 3A.

Figure 3B:
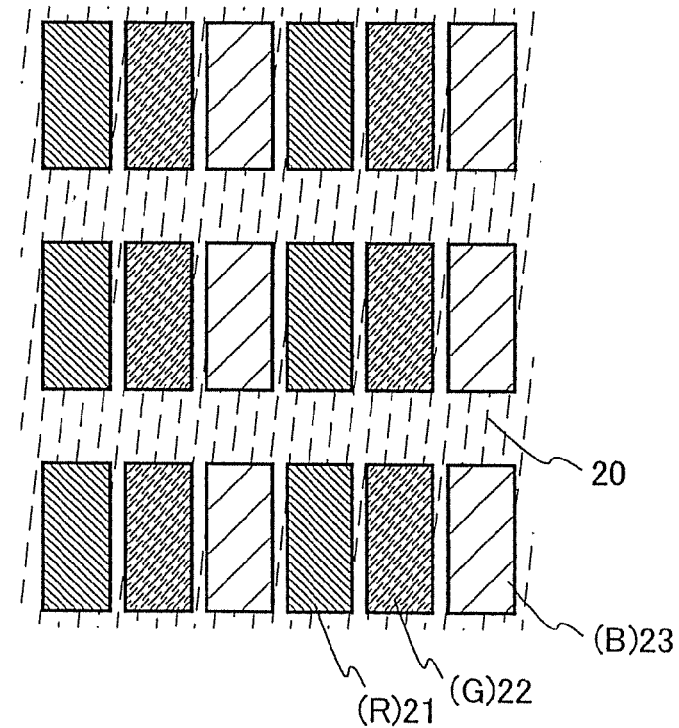

After third films 23 are formed in the third deposition step, the mask 14 and the third irradiated substrate are moved away from the deposition substrate. FIG. 3B is a top view illustrating the state.

Accordingly, the first films 21, the second films 22, and the third films 23 are selectively deposited at regular intervals. Then, the second electrodes are formed over these films by an electron beam evaporation method. Thus, the light-emitting elements are formed.

Through the above-described steps, a full-color display device can be manufactured.

Although the example in which the openings 16 of the mask 14 are rectangular is described in this embodiment mode, the present invention is not limited thereto, and stripe openings shown in FIG. 1 may be employed. In the case where the stripe openings are employed, although deposition is also performed between light-emitting regions which emit color of the same color, the film is formed over the insulator 20, and thus the portion which overlaps with the insulator 20 does not serve as a light-emitting region.

Figure 4A:
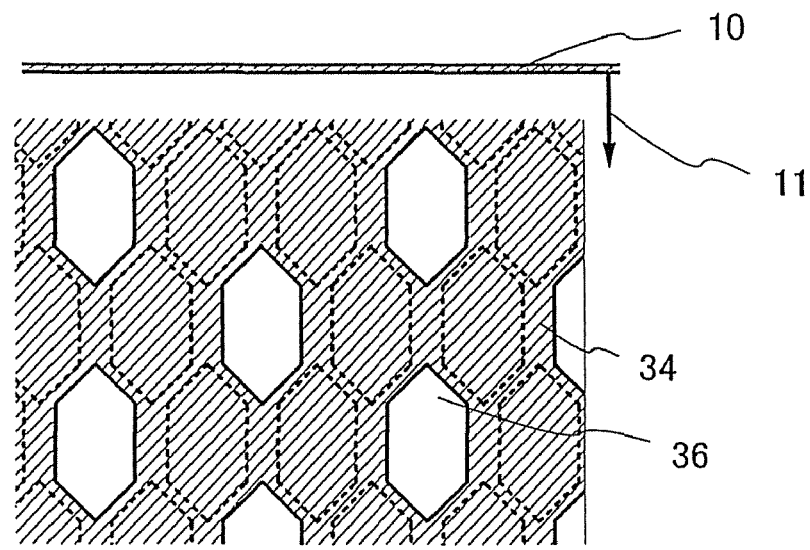
FIGS. 4A and 4B are views each illustrating a positional relationship between openings of a mask and a region irradiated with a laser beam.
Figure 4B:
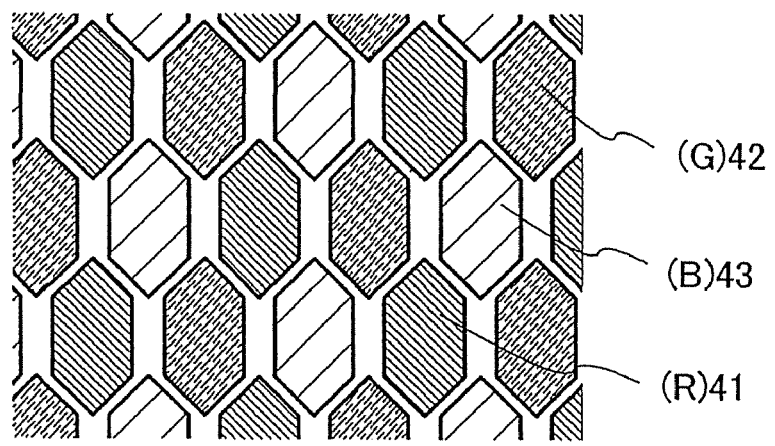

In addition, there is no particular limitation on the alignment of the pixels. The shape of one pixel may be polygonal, for example, hexagonal as shown in FIG. 4B, and a full-color display may be realized by placement of first films (R) 41, second films (G) 42, and third films (B) 43. The polygonal pixels shown in FIG. 4B are formed in such a manner that deposition is performed while relatively moving the irradiated region 10 in the scanning direction 11, with the laser beam with use of a mask 34 having hexagonal openings 36 shown in FIG. 4A.

Figure 5:
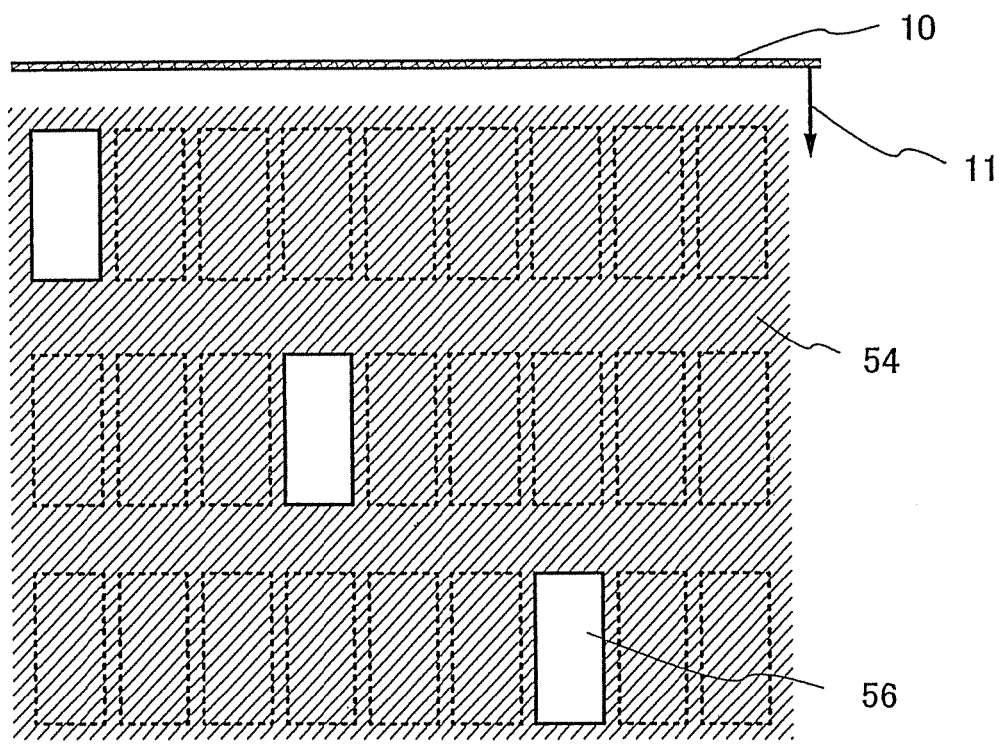
FIG. 5 is a view illustrating a positional relationship between openings of a mask and a region irradiated with a laser beam.

In addition, the number of deposition steps for forming the light-emitting layers which emit light of three colors is not limited to three, and the larger number of deposition steps may be employed for forming the light-emitting layers. For example, a mask 54 shown in FIG. 5 is used for the first deposition, and the first irradiated substrate is scanned by a laser beam with the mask 54 shifted by three pixels while the first irradiated substrate keeps the position, and thus the second deposition is performed. Deposition is repeated in this manner, and accordingly formation of the first films (R) is terminated. Then, the second films (G) and the third films (B) are formed in the same manner. This deposition method makes it possible to reduce the number of openings of the mask and increase the interval between the adjacent openings; thus, the processing accuracy of the mask can be increased. Although, in the openings shown in FIG. 3A, a plurality of regions of the light absorption layer which is heated by the laser beam at the same time is adjacent to one another, in the case where the alignment of the openings shown in FIG. 5 is employed, the number of light absorption layers which are heated by the laser beam at the same time is decreased and an effect of heat conduction can be suppressed. In addition, not only can the interval between the light-emitting regions arranged in row be reduced but also the interval between the light-emitting regions arranged in column can be reduced.

Although the example in which the long side direction of the linear laser beam and the scanning direction of the scanning unit are at right angles to each other is described, the present invention is not particularly limited thereto. Moreover, there is no particular limitation on the relationship between the openings of the mask and the scanning direction of the laser beam. Scanning may be performed in a direction which is perpendicular to the diagonal of the rectangular opening or in a direction which is parallel thereto. Also in this case, the number of light absorption layers which are heated by the laser beam at the same time is reduced, and an effect of heat conduction can be suppressed. A light-transmitting glass substrate is a substrate through which heat is not easily conducted, a mask is heated, and there is little possibility that the heat is conducted to the light absorption layer. However, an effect of heat conduction can occur depending on the scanning speed or the intensity of the laser beam, and therefore the scanning speed or the intensity of the laser beam is controlled as appropriate.

This embodiment mode can be freely combined with Embodiment Mode 1.

[Embodiment Mode 3]

Figure 6A:
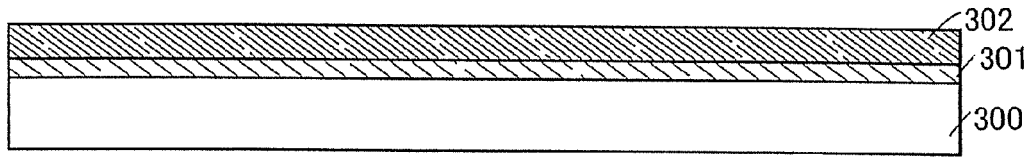
FIGS. 6A to 6C are cross-sectional views illustrating a manufacturing method of a light-emitting device.
Figure 6B:
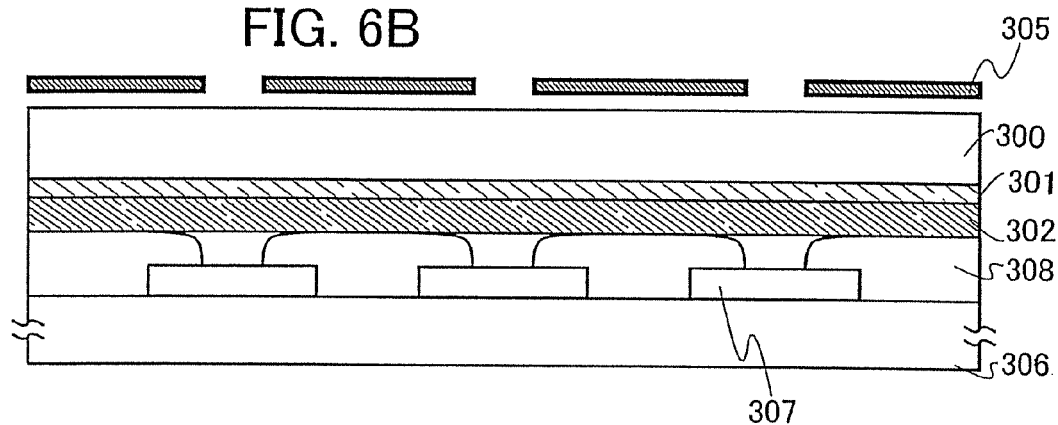
Figure 6C:
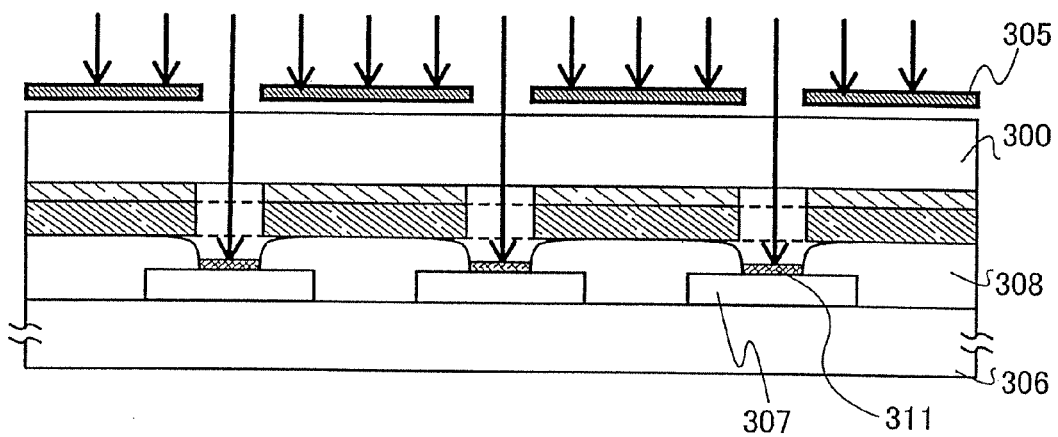

An example in which a gas generation layer which generates gas when irradiated with light is used instead of a light absorption layer will be shown in FIGS. 6A to 6C while the example in which the light absorption layer is used is described in Embodiment Mode 2.

An irradiated substrate 300 is prepared. A light-transmitting quartz substrate is used as the irradiated substrate 300, a gas generation layer 301 is formed over the irradiated substrate 300, and an organic compound-containing layer 302 is formed over the gas generation layer 301 (FIG. 6A).

For the gas generation layer 301, an amorphous silicon film containing hydrogen at a concentration of greater than or equal to 2 at. % and less than or equal to 20 at. %; an azide compound or a diazo compound which generates gas by decomposition generated when irradiated with ultraviolet rays; a resin composition in which microscopic bubbles are included; or the like is used. In this embodiment mode, as the gas generation layer 301, an amorphous silicon film containing hydrogen at a concentrating of 8 at. % formed by a plasma CVD method is used.

The same material as the organic compound-containing layer 202 described in Embodiment Mode 2 may be used for the organic compound-containing layer 302. In addition, an aggregate (preferably, with the number of molecules of less than or equal to 10) of organic compounds which do not have a sublimation property or solubility can be used for the organic compound-containing layer 302. Moreover, a low molecular organic material, a high molecular organic material, or a middle molecular organic material which has a property between low molecule and high molecule can be used as the organic compound-containing layer 302. Furthermore, a composite material of an organic material and an inorganic material can be used as the organic compound-containing layer 302. A middle molecular organic material refers to an organic compound, a chained molecule of which has a length of less than or equal to 5 μm, preferably less than or equal to 50 nm, or an aggregate (preferably, with the number of molecules of less than or equal to 10) of organic compounds which do not have a sublimation property or solubility.

Then, a deposition substrate 306 is placed at a position facing a surface of the irradiated substrate for which the gas generating layer 301 and the organic compound-containing layer 302 are provided. In this embodiment mode, the deposition substrate 306 is placed so that an insulator 308 provided for the deposition substrate and the organic compound-containing layer 302 provided for the irradiated substrate 300 are in contact with each other.

Next, a mask 305 having openings is placed at a position facing the other surface of the irradiated substrate 300 (FIG. 6B).

Then, a rectangular leaser beam is emitted to the mask 305, and a surface of the gas generation layer 301 is scanned by a laser beam which has passed through the openings of the mask. Regions of the gas generating layer 301 which are irradiated with the laser beam generate gas, and part of the organic compound-containing layer 302 is separated. Since the organic compound-containing layer 302 is thin, it is separated by ablation of the gas generation layer 301 and is attached onto first electrodes 307. In addition, since the gas generation layer 301 is removed, the organic compound-containing layer 302 is irradiated with the laser beam, and then it is firmly attached to the surfaces of the first electrodes 307. Accordingly, an organic compound-containing layers 311 are deposited over the deposition substrate 306 (FIG. 6C). Note that the deposition is performed using atmospheric pressure under an inert gas atmosphere from which moisture is removed. Alternatively, the deposition can be performed under a reduced pressure atmosphere.

Since the laser beam is emitted even after the organic compound-containing layers 302 are attached to the surfaces of the first electrodes 307, the following may also be used as the organic compound-containing layer 302: a thin film to which liquid in which a monomer (an organic compound) which is photo-polymerized is dissolved or dispersed in a solvent is applied as application liquid by a wet process such as a spin coating method, a spray coating method, or a dip coating method. The monomer which is photo-polymerized may be selected as appropriate from the following organic substances in accordance with a solvent to be used, for example: monomers having an unsaturated double bond group such as a vinyl group (C=C—) such as N-vinylcarbazole or 9,9'-dimethyl-2-binylfluorene; an acroyl group (C=C—COO—); and an allyl group (C=C—C—). As a photopolymerization initiator, the following may be used, for example: 2-chlorothiochitosan; benzophenone; a keton-based photopolymerization initiator such as Michler's ketone; an acetophenone-based photopolymerization initiator such as diethoxyacetophenone or 2-hydroxy-2-methyl-1-phenylpropane-1-on; benzyl; or the like.

In addition, if necessary, a process for heating the organic compound-containing layer 311 may be performed. In this embodiment mode, fine powder of silicon can be attached to the surfaces of the organic compound-containing layers 311 because the amorphous silicon film is used. In that case, a process for washing the surfaces of the organic compound-containing layers 311 may be performed. When a diazo compound is used instead of the amorphous silicon film containing hydrogen as the gas generation layer 301, the gas generation layer 301 is gasified, and thus a washing process is not needed.

This embodiment mode can be freely combined with Embodiment Mode 1 or Embodiment Mode 2.

The present invention including the above-described structure is described in more detail in embodiments below.

[Embodiment 1]

In this embodiment, an example of manufacturing a passive matrix light-emitting device over a glass substrate will be described with reference to FIGS. 7A to 7C, FIG. 8, and FIG. 9.

In a passive matrix (simple matrix) light-emitting device, a plurality of anodes arranged in stripes and a plurality of cathodes arranged in stripes are provided so as to intersect at right angles, and a light-emitting layer or a fluorescent layer is interposed at each intersecting point of the anode and the cathode. Thus, a pixel at an intersection of an anode which is selected (to which voltage is applied) and a cathode which is selected emits light.

Figure 7A:
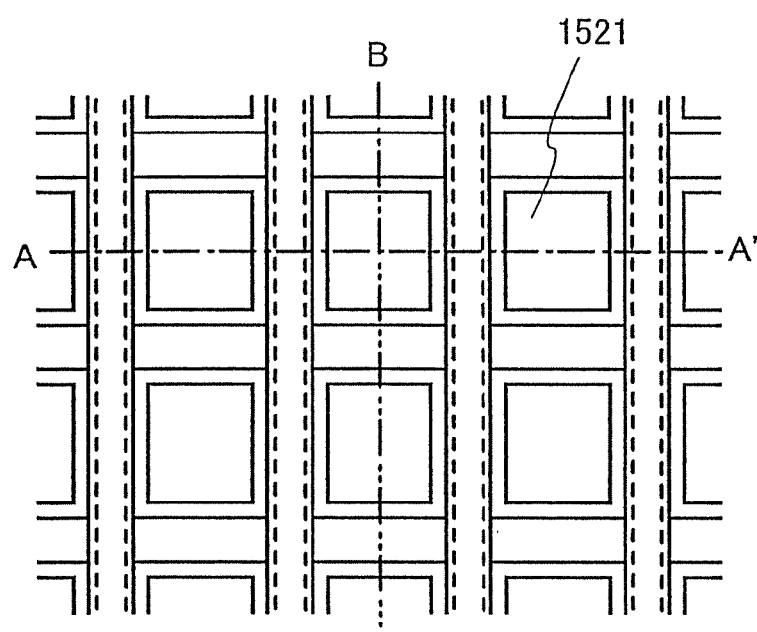
FIG. 7A is a top view of a passive matrix light-emitting device and FIGS. 7B and 7C are cross-sectional views each illustrating the same.
Figure 7C:
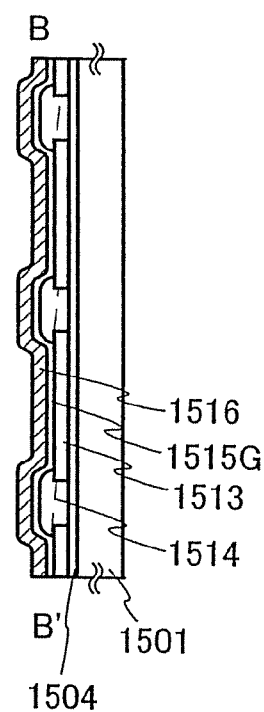
Figure 7B:
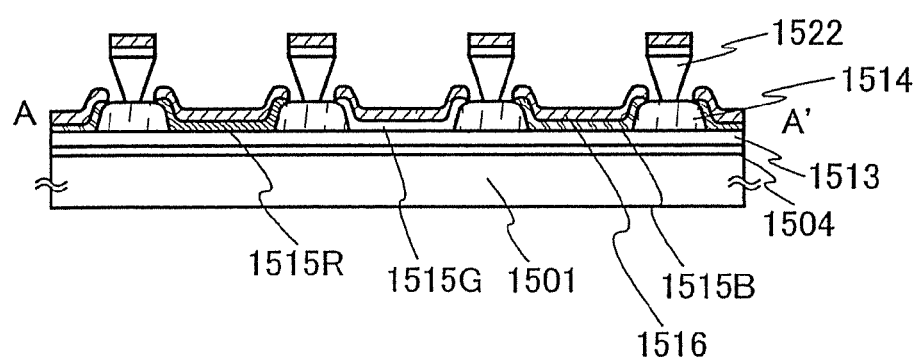

FIG. 7A is a top view of a pixel portion before sealing. FIG. 7B is a cross-sectional view taken along a dashed line A-A' in FIG. 7A. FIG. 7C is a cross-sectional view taken along a dashed line B-B' in FIG. 7A.

An insulating film 1504 is formed as a base insulating film over a first substrate 1501. Note that the insulating film 1504 is not necessarily formed if the base insulating film is not needed. A plurality of first electrodes 1513 is arranged in stripes at regular intervals over the insulating film 1504. A partition wall 1514 having openings corresponding to pixels is provided over the first electrodes 1513. The partition wall 1514 having openings is formed using an insulating material (a photosensitive or nonphotosensitive organic material (e.g., polyimide, acrylic, polyamide, polyimide amide, a resist, or benzocyclobutene) or an SOG film (e.g., a $SiO_x$ film including an alkyl group)). Note that each opening corresponding to a pixel serves as a light-emitting region 1521.

A plurality of inversely-tapered partition walls 1522 parallel to each other is provided over the partition wall 1514 having openings which intersect with the first electrodes 1513. The inversely-tapered partition walls 1522 are formed by a photolithography method using a positive-type photosensitive resin, portion of which unexposed to light remains as a pattern, and by adjustment of the amount of light exposure or the length of development time so that a lower portion of a pattern is etched more.

Figure 8:
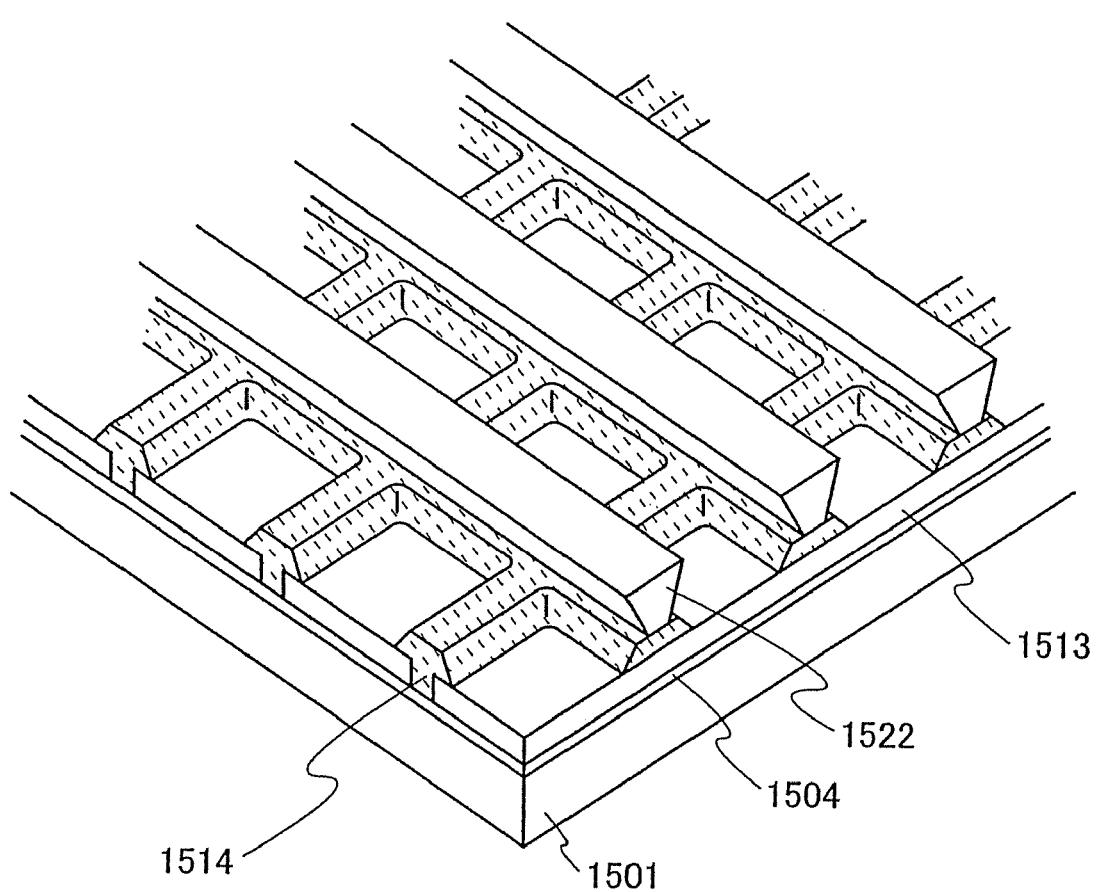
FIG. 8 is a perspective view of a passive matrix light-emitting device.

FIG. 8 is a perspective view illustrating the state immediately after formation of the plurality of inversely-tapered partition walls 1522 parallel to each other. Note that the same reference numerals are used to denote the same portions as those in FIGS. 7A to 7C.

The thickness of the inversely-tapered partition wall 1522 is set to be larger than the total thickness of a conductive film and a stacked film including a light-emitting layer. When the conductive film and the stacked film including a light-emitting layer are stacked over the first substrate having the structure shown in FIG. 8, the stacked film is separated into a plurality of regions electrically isolated from one another, which are a stacked film of a second electrode 1516 and a stacked film 1515R including a light-emitting layer; a stacked film of the second electrode 1516 and a stacked film 1515G including a light-emitting layer; and a stacked film of the second electrode 1516 and a stacked film 1515B including a light-emitting layer, as shown in FIGS. 7A to 7C. The second electrodes 1516 are electrodes in stripes, which are parallel to one another and extend along a direction intersecting with the first electrodes 1513. Note that, although the conductive films and stacked films each including a light-emitting layer are also formed over the inversely-tapered partition walls 1522, they are separated from the stacked film of the second electrode 1516 and the stacked film 1515R including the light-emitting layer; the stacked film of the second electrode 1516 and the stacked film 1515G including the light-emitting layer; and the stacked film of the second electrode 1516 and the stacked film 1515B including the light-emitting layer.

This embodiment mode describes an example of forming a light-emitting device which provides three kinds of light emissions (R, Q and B) and is capable of performing full color display, by selective formation of the stacked films 1515R, 1515G, and 1515B each including the light-emitting layer. The stacked films 1515R, 1515G, and 1515B each including the light-emitting layer are formed into a stripe pattern in which the stacked films are parallel to one another.

In this embodiment mode, the stacked films each including the light-emitting layer are formed using the manufacturing apparatus shown in FIG. 1. The following substrates are prepared: a first irradiated substrate over which a light-emitting layer from which red light emission is obtained is formed, a second irradiated substrate over which a light-emitting layer from which green light emission is obtained is formed, and a third irradiated substrate over which a light-emitting layer from which blue light emission is obtained is formed. Then, a deposition substrate provided with the first electrodes 1513 is transferred to the manufacturing apparatus shown in FIG. 1. Then, the first irradiated substrate is irradiated with a laser beam having an irradiated area that is the same as one side of the substrate or longer than that to heat a light absorption layer, whereby deposition is performed. Next, deposition is selectively performed on the second irradiated substrate and the third irradiated substrate as appropriate. The use of the manufacturing apparatus shown in FIG. 1 enables selective deposition, and thus the inversely-tapered partition walls 1522 can be unnecessary.

Alternatively, stacked films each including a light-emitting layer which emits light of the same emission color may be formed over an entire surface to provide a monochromatic light-emitting elements, whereby a light-emitting device that is capable of performing monochromatic display or a light-emitting device that is capable of performing area color display may be provided. Further alternatively, a light-emitting device that is capable of performing full color display may be provided by combination of a light-emitting device which provides white light emission and color filters.

In addition, if necessary, sealing is performed using a sealing material such as a sealing can or a glass substrate for sealing. In this embodiment mode, a glass substrate is used as a second substrate, and a first substrate and the second substrate are attached to each other using an adhesive material such as a sealant, whereby a space surrounded by the adhesive material such as a sealant is sealed off. The sealed space is filled with filler or a dry inert gas. In addition, a desiccant or the like may be put between the first substrate and the sealing material so that reliability of the light-emitting device is increased. A small amount of moisture is removed by the desiccant, whereby sufficient drying is performed. As the desiccant, a substance which adsorbs moisture by chemical adsorption, such as an oxide of an alkaline earth metal such as calcium oxide or barium oxide, can be used. Alternatively, a substance which adsorbs moisture by physical adsorption, such as zeolite or silica gel, can be used as another desiccant.

Note that a desiccant is not necessarily provided when a sealing material which is in contact with the light-emitting element to cover the light-emitting element is provided and the light-emitting element is sufficiently blocked from outside air.

Figure 9:
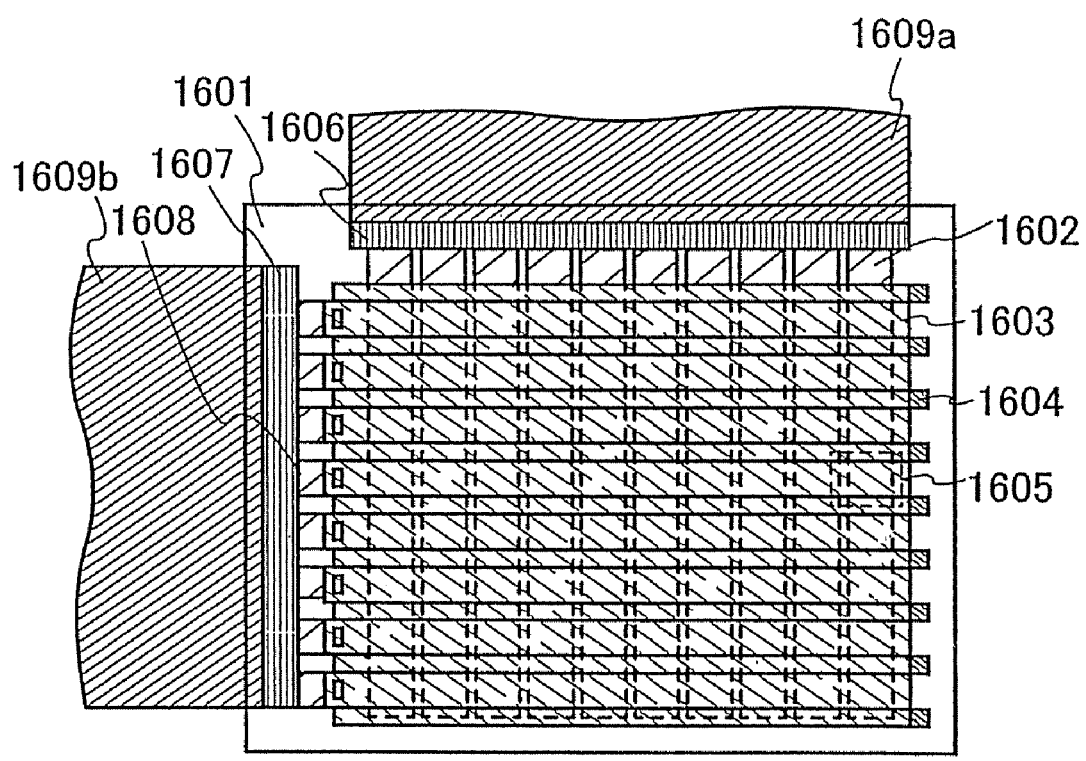
FIG. 9 is a top view of a passive matrix light-emitting device.

FIG. 9 is a top view of a light-emitting module mounted with an FPC or the like.

In a pixel portion for displaying images, scan lines and data lines intersect with each other so as to cross at right angles, as shown in FIG. 9.

The first electrodes 1513 in FIGS. 7A to 7C correspond to scan lines 1603 in FIG. 9, the second electrodes 1516 correspond to data lines 1602, and the inversely-tapered partition walls 1522 correspond to partition walls 1604. Light-emitting layers are interposed between the data lines 1602 and the scan lines 1603, and an intersection portion indicated by a region 1605 corresponds to one pixel.

Note that the scan lines 1603 are electrically connected to connection wirings 1608 at the ends of the wirings, and the connection wirings 1608 are connected to an FPC 1609b through an input terminal 1607. The data lines 1602 are connected to an FPC 1609a through an input terminal 1606.

If necessary, a polarizing plate, a circularly polarizing plate (including an elliptically polarizing plate), a retardation plate (a quarter-wave plate or a half-wave plate), or an optical film such as a color filter may be provided as appropriate over a light-emitting surface. In addition, the polarizing plate or the circularly polarizing plate may be provided with an anti-reflection film. For example, anti-glare treatment may be carried out by which reflected light can be diffused by projections and depressions on the surface so as to reduce the glare.

Through the above-described steps, the flexible passive matrix light-emitting device can be manufactured. If the inversely-tapered partition wall can be unnecessary with the use of the manufacturing apparatus of the present invention, the element structure can be drastically simplified and the time needed for the manufacturing process can be shortened.

Although the example in which a driver circuit is not provided over a substrate is shown in FIG. 9, an IC chip including a driver circuit may be mounted over the substrate.

When an IC chip is mounted, a data line side IC and a scan line side IC, in each of which a driver circuit for transmitting a signal to the pixel portion is formed, are mounted on the periphery of (outside) the pixel portion by a COG method. The mounting may be performed using a TCP or a wire bonding method other than the COG method. TCP is a TAB tape mounted with an IC, and the TAB tape is connected to a wiring over an element formation substrate to mount the IC. Each of the data line side IC and the scan line side IC may be formed using a silicon substrate. Alternatively, it may be one in which a driver circuit is formed using TFTs over a glass substrate, a quartz substrate, or a plastic substrate. Although described here is an example in which a single IC is provided on one side, a plurality of divided ICs may be provided on one side.

This embodiment mode can be combined with any one of Embodiment Modes 1 to 3.

[Embodiment 2]

In this embodiment, an active matrix light-emitting device formed with use of the manufacturing apparatus shown in FIG. 1 will be described with reference to FIGS. 10A and 10B. FIG. 10A is a top view illustrating a light-emitting device, and FIG. 10B is a cross-sectional view taken along the line A-A' of FIG. 10A. A reference numeral 1701 indicated by a dotted line denotes a driver circuit portion (source side driver circuit); 1702 denotes a pixel portion; 1703 denotes a driver circuit portion (gate side driver circuit); 1704 denotes a sealing substrate; 1705 denotes a sealant, and 1707 denotes a space surrounded by the sealant 1705.

A reference numeral 1708 denotes a wiring for transmitting a signal input to the source side driver circuit 1701 and the gate side driver circuit 1703, and the wiring 1708 receives a video signal, a clock signal, a start signal, a reset signal, and the like from an flexible printed circuit (FPC) 1709 that is to be an external input terminal. Although only the FPC is illustrated here, a printed wiring board (PWB) may be attached to the FPC. The light-emitting device in the present specification includes, in its category, not only the light-emitting device itself but also the light-emitting device provided with the FPC or the PWB.

Next, a cross-sectional structure will be described with reference to FIG. 10B. Although a driver circuit portion and a pixel portion are formed over an element substrate 1710, a pixel portion 1702 and a source side driver circuit 1701 that is a driver circuit portion are illustrated here.

As the source side driver circuit 1701, a CMOS circuit in which an n-channel TFT 1723 and a p-channel TFT 1724 are combined is formed. A circuit included in the driver circuit may be a known CMOS circuit, PMOS circuit, or NMOS circuit. In this embodiment, a driver-integrated type in which a driver circuit is formed over the same substrate is described; however, it is not necessary to have such a structure, and the driver circuit can be formed not over the substrate but outside the substrate.

The pixel portion 1702 is formed of a plurality of pixels each including a switching TFT 1711, a current control TFT 1712, and an anode 1713 that is electrically connected to a drain of the current control TFT 1712. An insulator 1714 is formed so as to cover an end portion of the anode 1713. Here, the insulator 1714 is formed using a positive type photosensitive acrylic resin film.

The insulator 1714 is formed so as to have a curved surface having curvature at an upper and lower end portions thereof in order to obtain favorable coverage. For example, when a positive type photosensitive acrylic is used as a material for the insulator 1714, a curved surface having a radius of curvature (0.2 to 3 μm) is desirably formed at the upper end portion of the insulator 1714. For the insulator 1714, either a negative type that becomes insoluble in an etchant by photosensitive light or a positive type that becomes soluble in an etchant by light can be used, and an inorganic compound such as silicon oxide or silicon oxynitride can be used as well as an organic compound.

A light-emitting element 1715 and a cathode 1716 are formed over the anode 1713. Here, as a material used for the anode 1713, a material having a high work function is desirably used. For example, the following structures can be given: a stacked film of a titanium nitride film and a film containing aluminum as its main component; a stacked film having a three-layer structure of a titanium nitride film, a film containing aluminum as its main component, and a titanium nitride film; and the like as well as a single-layer film of an indium tin oxide film, an indium tin oxide film containing silicon, an indium zinc oxide film, a titanium nitride film, a chromium film, a tungsten film, a zinc film, a platinum film, or the like. In the case where the anode 1713 is formed of an indium tin oxide film and a wiring of the current control TFT 1712 connected to the anode 1713 has a stacked structure of a titanium nitride film and a film containing aluminum as its main component or a stacked structure of a titanium nitride film, a film containing aluminum as its main component, and a titanium nitride film, resistance of the wiring is low, a favorable ohmic contact with the indium tin oxide film can be formed, and further the anode 1713 can be made to serve as an anode. The anode 1713 may be formed using the same material as a first anode in the light-emitting element 1715. Alternatively, the anode 1713 may be stacked in contact with the first anode in the light-emitting element 1715.

The light-emitting element 1715 has a structure in which the anode 1713, an organic compound-containing layer 1700, and the cathode 1716 are stacked; specifically, a hole injecting layer, a hole transporting layer, a light-emitting layer, an electron transporting layer, an electron injecting layer, and the like are stacked as appropriate. The light-emitting element 1715 may be formed with use of any one of the deposition apparatuses described in Embodiment Modes 1 to 3.

A material (Al, Ag, Li, Ca, or an alloy thereof: MgAg, MgIn, AlLi, calcium fluoride, or calcium nitride) having a low work function may be used as a material for the cathode 1716; however, the material for the cathode 1716 is not limited to the above and can employ a variety of conductive layers by selection of an appropriate electron injecting material. When light emitted from the light-emitting element 1715 is made to be transmitted through the cathode 1716, for the cathode 1716, it is possible to use a stacked layer of a metal thin film with a reduced film thickness and a transparent conductive film of an indium oxide-tin oxide alloy, an indium oxide-zinc oxide alloy, zinc oxide, or the like. The cathode 1716 may be formed using the same material as a second cathode in the light-emitting element 1715. Alternatively, the cathode 1716 may be stacked in contact with the second cathode in the light-emitting element 1715.

Furthermore, the sealing substrate 1704 and the element substrate 1710 are attached to each other with the sealant 1705, whereby the light-emitting element 1715 is provided in a space 1707 surrounded by the element substrate 1710, the sealing substrate 1704, and the sealant 1705. Note that the space 1707 may be filled with the sealant 1705 as well as an inert gas (e.g., nitrogen or argon).

Note that an epoxy resin is desirably used as the sealant 1705. In addition, such a material is desirably a material which does not transmit moisture or oxygen as much as possible. As a material used for the sealing substrate 1704, a plastic substrate made of FRP (fiberglass-reinforced plastics), PVF (polyvinyl fluoride), polyester, acrylic, or the like can be used as well as a glass substrate or a quartz substrate.

As described above, the light-emitting device including the light-emitting element can be obtained with use of the manufacturing apparatus of the present invention. A manufacturing cost per substrate tends to be high because of TFT manufacturing; however, the manufacturing apparatus of the present invention shown in FIG. 1 that is a manufacturing apparatus in which a film-thickness monitor is not used makes it possible to drastically reduce deposition process time per substrate and realize drastic reduction in cost per light-emitting device. In addition, material use efficiency can be increased, and thus reduction in manufacturing cost can be realized.

The light-emitting device described in this embodiment can be implemented in free combination with the deposition apparatus described in Embodiment Mode 1 or the manufacturing method described in Embodiment Mode 2 or Embodiment Mode 3. Furthermore, if necessary, a chromaticity conversion film such as a color filter may be used in the light-emitting device described in this embodiment.

As an active layer of a TFT which is placed in the pixel portion 1702, the following can be used as appropriate: an amorphous semiconductor film, a semiconductor film including a crystalline structure, a compound semiconductor film including an amorphous structure, or the like. In addition, as the active layer of the TFT, a semi-amorphous semiconductor film (also referred to as a microcrystalline semiconductor film) including a crystalline region, which is a semiconductor having an intermediate structure between an amorphous structure and a crystalline structure (including a single crystal structure and a polycrystalline structure), and a third condition that is stable in terms of free energy. A crystal grain of 0.5 to 20 nm is contained in at least part of the semi-amorphous semiconductor film. The raman spectrum is shifted to a lower wavenumber side than 520 cm$^{-1}$. The diffraction peaks of (111) and (220) that are thought to be derived from a Si crystal lattice are observed by X-ray diffraction. In addition, the semi-amorphous semiconductor film contains hydrogen or halogen of at least greater than or equal to 1 at. % to terminate dangling bonds. The semi-amorphous semiconductor film is formed by glow discharge decomposition (plasma CVD) of a material gas such as SiH$_4$ as well as Si$_2$H$_6$, SiH$_2$Cl$_2$, SiHCl$_3$, SiCl$_4$, SiF$_4$, or the like. The above-described material gas may be diluted with H$_2$, or H$_2$ and one or more selected from He, Ar, Kr, or Ne. A dilution ratio may be in the range of 2 to 1000 times, pressure may be in the range of 0.1 to 133 Pa, a power supply frequency may be 1 to 120 MHz preferably 13 to 60 MHz, and a substrate heating temperature may be less than or equal to 300° C., preferably 100 to 250° C. The concentration of an atmospheric constituent impurity such as oxygen, nitrogen, or carbon, as an impurity element in the film, is preferably less than or equal to $1\times10^{20}$ cm$^{-1}$; in particular, the concentration of oxygen is less than or equal to $5\times10^{19}$ cm$^3$, preferably less than or equal to $1\times10^{19}$ cm$^3$. The electron field-effect mobility μ of a TFT in which the semi-amorphous semiconductor film is used as the active layer is 1 to 10 cm$^3$/Vsec.

[Embodiment 3]

In this embodiment mode, with reference to FIGS. 11A to 11E, a variety of electronic devices which are completed by use of a light-emitting device manufactured by application of the present invention will be described.

As electronic devices which are manufactured with use of the manufacturing apparatus of the present invention, the following are given: televisions, cameras such as video cameras or digital cameras, goggle type displays (head mount displays), navigation systems, audio reproducing devices (e.g., car audio component stereos and audio component stereos), laptop personal computers, game machines, portable information terminals (e.g., mobile computers, cellular phones, portable game machines, and electronic books), and image reproducing devices provided with recording media (specifically, the devices that can reproduce a recording medium such as a digital versatile disc (DVD) and is provided with a display device capable of displaying the reproduced images), lighting equipment, and the like. Specific examples of these electronic devices are shown in FIGS. 11A to 11E.

Figure 11A:
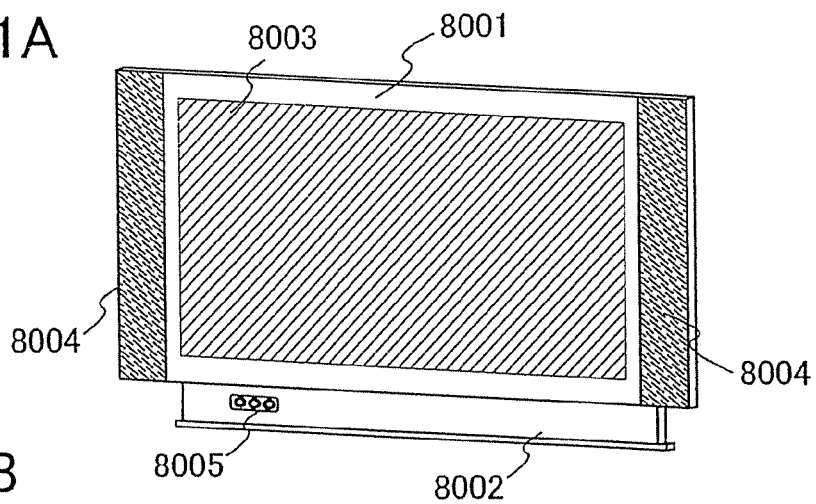
FIGS. 11A to 11E are diagrams illustrating examples of electronic devices.

FIG. 11A shows a display device, which includes a chassis 8001, a supporting base 8002, a display portion 8003, speaker portions 8004, video input terminals 8005, and the like. The display device is manufactured using a light-emitting device manufactured using the present invention for the display portion 8003. Note that the display device includes all devices for displaying information in its category, for example, devices for a personal computer, for receiving TV broadcasting, and for displaying an advertisement. The manufacturing apparatus of the present invention makes it possible to drastically reduce manufacturing cost and provide an inexpensive display device.

Figure 11B:
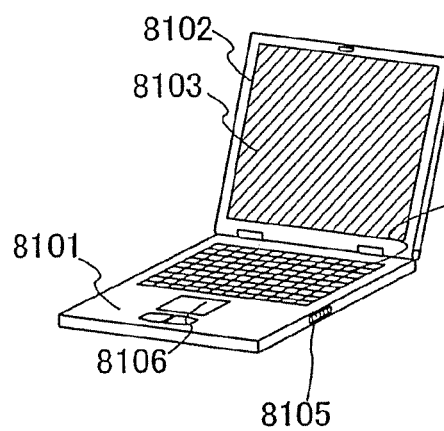

FIG. 11B shows a laptop personal computer, which includes a main body 8101, a chassis 8102, a display portion 8103, a keyboard 8104, an external connection port 8105, a mouse 8106, and the like. A light-emitting device which has a light-emitting element formed with use of the manufacturing apparatus of the present invention is used for the display portion 8103, and thus the laptop personal computer is manufactured. The manufacturing apparatus of the present invention makes it possible to drastically reduce manufacturing costs and provide an inexpensive laptop personal computer.

Figure 11C:
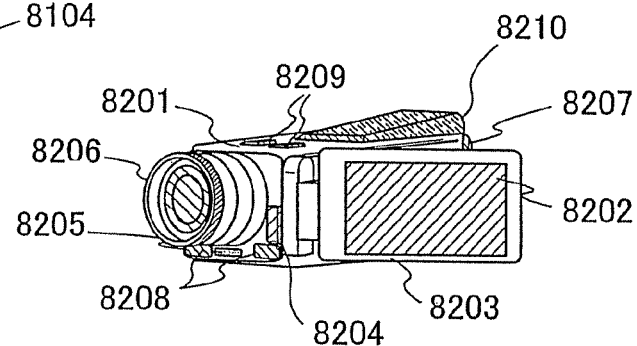

FIG. 11C shows a video camera, which includes a main body 8201, a display portion 8202, a chassis 8203, an external connection port 8204, a remote control receiving portion 8205, an image receiving portion 8206, a battery 8207, an audio input portion 8208, operation keys 8209, an eyepiece portion 8210, and the like. A light-emitting device which has a light-emitting element formed with use of the manufacturing apparatus of the present invention is used for the display portion 8202, and thus the video camera is manufactured. The manufacturing apparatus of the present invention makes it possible to drastically reduce manufacturing cos and provide an inexpensive video camera.

Figure 11D:
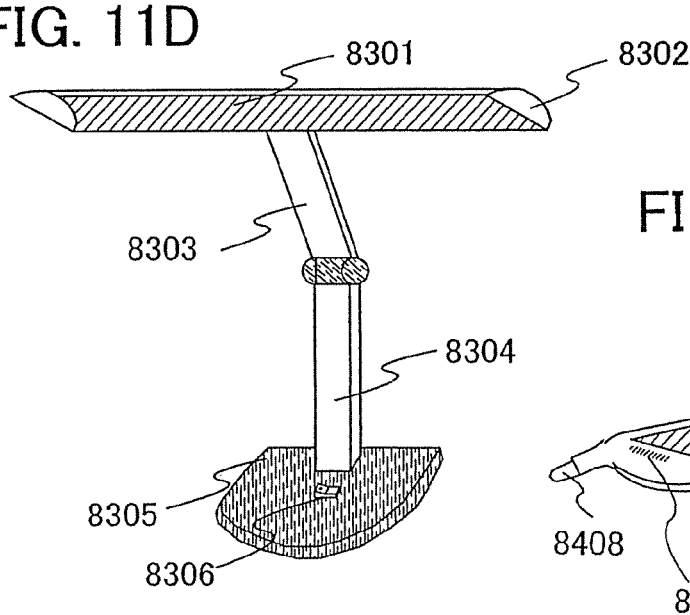

FIG. 11D shows desk lighting equipment, which includes a lighting portion 8301, a shade 8302, an adjustable arm 8303, a support 8304, a base 8305, and a power supply 8306. A light-emitting device manufactured with use of the manufacturing apparatus of the present invention is used for the lighting portion 8301, and thus the desk lighting equipment is manufactured. Note that the lighting equipment includes a ceiling-fixed lighting equipment, a wall-hanging lighting equipment, and the like in its category. The manufacturing apparatus of the present invention makes it possible to drastically reduce manufacturing cost and provide inexpensive desk lighting equipment.

Figure 11E:
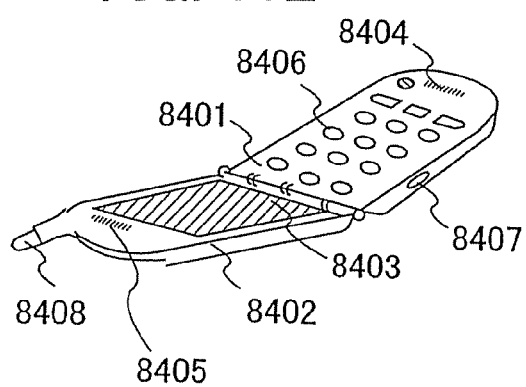

FIG. 11E shows a cellular phone, which includes a main body 8401, a chassis 8402, a display portion 8403, an audio input portion 8404, an audio output portion 8405, operation keys 8406, an external connection port 8407, an antenna 8408, and the like. A light-emitting device which has a light-emitting element with use of the manufacturing apparatus of the present invention is used for the display portion 8403, and thus the cellular phone is manufactured. The manufacturing apparatus of the present invention makes it possible to drastically reduce manufacturing cost and provide an inexpensive cellular phone.

An application of a mobile object in which a light-emitting device including a light-emitting element formed with use of the manufacturing apparatus of the present invention is mounted on a lighting device or a display panel is described with reference to FIG. 12. In this embodiment, as the mobile object, a train vehicle body, a car body, an airplane body, and the like, for example, a two-wheeled motor vehicle, a four-wheeled motor vehicle (including an automobile, a bus, and the like), a train (including a monorail, a railway, and the like), ship and vessel, and the like are given.

Figure 12:
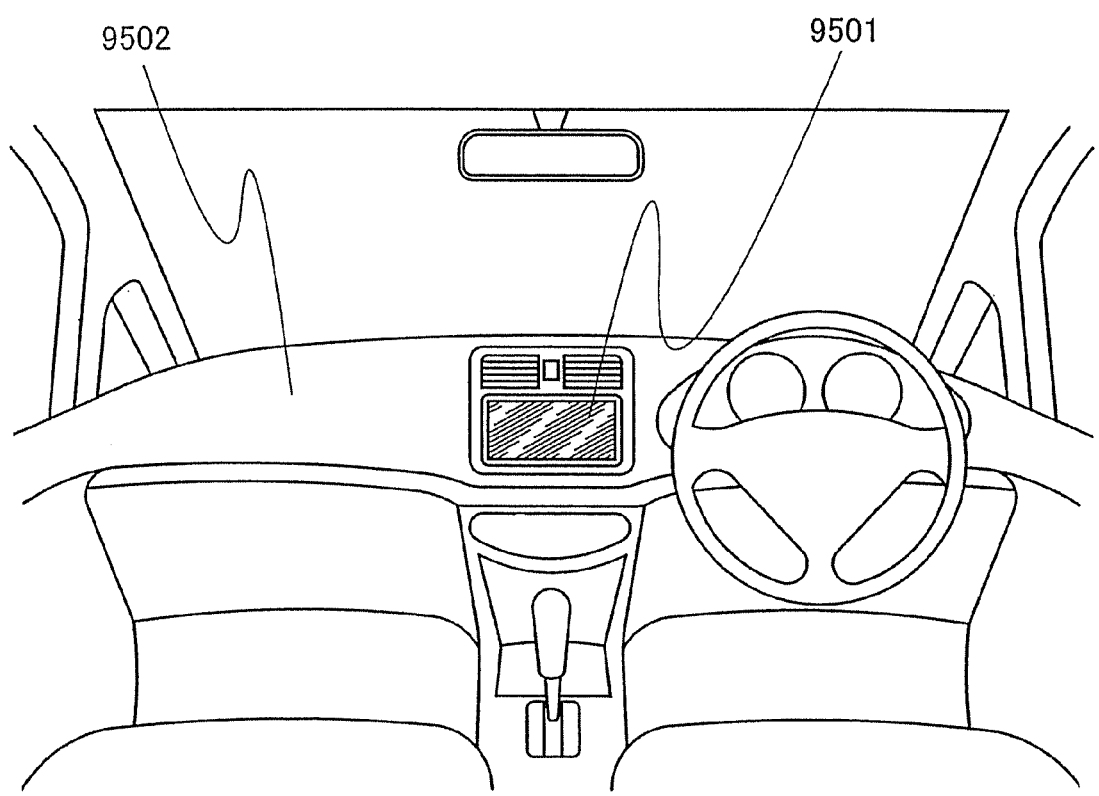
FIG. 12 is a diagram illustrating an example of an electronic device.

As an example of a display panel which includes, as a display portion, a light-emitting device which has a light-emitting element formed with use of the manufacturing apparatus of the present invention, a mobile object incorporated with a display device is shown in FIG. 12. FIG. 12 shows an example of a display panel 9501 mounted on a car body 9502 as the example of the mobile object incorporated with a display device. The display panel 9501 included as the display portion, which is shown in FIG. 12 is mounted on the car body, whereby the display panel is capable of on-demand display of operation of the car body or information input from inside or outside of the car and has a function of navigating a destination of the car. In addition, the display panel 9501 can also be used as a light in the car.

Note that the light-emitting device which has the light-emitting element formed with use of the manufacturing apparatus of the present invention can be applied to not only a front part of the car body as shown in FIG. 12 but also all sorts of positions including a ceiling, a glass window, and a door by being transformed to function as a lighting device or a display device.

As described above, the electronic devices or the lighting equipment using the light-emitting element formed by use of the manufacturing apparatus of the present invention can be obtained. The application range of the light-emitting device including the light-emitting element formed by use of the manufacturing apparatus of the present invention is so wide that the light-emitting device can be applied to electronic devices in various fields.

The light-emitting device described in this embodiment can be implemented in free combination with the deposition apparatus described in Embodiment Mode 1 or Embodiment Mode 3, or the deposition method described in Embodiment Mode 2. In addition, the light-emitting device can be implemented in free combination with any one of Embodiments 1 to 3.

This application is based on Japanese Patent Application serial no. 2007-147413 filed with Japan Patent Office on Jun. 1, 2007, the entire contents of which are hereby incorporated by reference.

What is claimed is:

1. A method for manufacturing a light-emitting device, comprising the steps of:
placing a deposition substrate so that one surface of the deposition substrate and one surface of an irradiated substrate face each other wherein a light absorption layer and a first material layer are provided for the one surface of irradiated substrate;
scanning the other surface of the irradiated substrate by a laser beam through a light control unit in one direction so that the light absorption layer is selectively heated by the laser beam, whereby the light absorption layer heats and gasifies the first material layer; and
depositing a second material layer on the one surface of the deposition substrate,
wherein the laser beam is elongated in a perpendicular direction to the one direction.

2. The method for manufacturing a light-emitting device according to claim 1, wherein the light control unit is selected from the group consisting of a photomask, a slit, or a metal mask.

3. The method for manufacturing a light-emitting device according to claim 1, wherein the first material layer includes an organic compound.

4. The method for manufacturing a light-emitting device according to claim 1, wherein the laser beam has a length from 20 to 100 cm in the perpendicular direction to the one direction.

5. The method for manufacturing a light-emitting device according to claim 1, wherein the one surface of the deposition substrate is an electrode.

6. The method for manufacturing a light-emitting device according to claim 1, the step of depositing the second material layer is performed at $5 \times 10^{-3}$ Torr or less.

7. A method for manufacturing a light-emitting device, comprising the steps of:
placing a deposition substrate so that one surface of the deposition substrate and one surface of an irradiated substrate face each other wherein at least a light absorption layer and a first material layer are provided for the one surface of irradiated substrate;
scanning the light absorption layer by a laser beam through the irradiated substrate and a light control unit in one direction so that the light absorption layer is selectively heated by the laser beam, whereby the light absorption layer heats and gasifies the first material layer; and
depositing a second material layer on the one surface of the deposition substrate, wherein the laser beam is elongated in a perpendicular direction to the one direction.

8. The method for manufacturing a light-emitting device according to claim 7, wherein the light control unit is selected from the group consisting of a photomask, a slit, or a metal mask.

9. The method for manufacturing a light-emitting device according to claim 7, wherein the first material layer includes an organic compound.

10. The method for manufacturing a light-emitting device according to claim 7, wherein the laser beam has a length from 20 to 100 cm in the perpendicular direction to the one direction.

11. The method for manufacturing a light-emitting device according to claim 7, wherein the one surface of the deposition substrate is an electrode.

12. The method for manufacturing a light-emitting device according to claim 7, the step of depositing the second material layer is performed at $5\times10^{-3}$ Torr or less.

* * * * *